(12) United States Patent
Male et al.

(10) Patent No.: US 9,349,933 B2
(45) Date of Patent: May 24, 2016

(54) VERTICAL THERMOELECTRIC STRUCTURES

(71) Applicant: TEXAS INSTRUMENTS INCORPORATED, Dallas, TX (US)

(72) Inventors: Barry Jon Male, West Granby, CT (US); Philip L. Hower, Concord, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 54 days.

(21) Appl. No.: 14/180,744

(22) Filed: Feb. 14, 2014

(65) Prior Publication Data

US 2014/0216517 A1    Aug. 7, 2014

Related U.S. Application Data

(62) Division of application No. 12/544,548, filed on Aug. 20, 2009, now Pat. No. 8,728,846.

(60) Provisional application No. 61/090,312, filed on Aug. 20, 2008.

(51) Int. Cl.
    *H01L 35/30* (2006.01)
    *H01L 23/38* (2006.01)
    *H01L 35/32* (2006.01)

(52) U.S. Cl.
    CPC ............... *H01L 35/30* (2013.01); *H01L 23/38* (2013.01); *H01L 35/32* (2013.01); *H01L 2924/0002* (2013.01); *H01L 2924/3011* (2013.01)

(58) Field of Classification Search
    CPC .......... H01L 35/30; H01L 23/38; H01L 35/32
    See application file for complete search history.

(56) References Cited

U.S. PATENT DOCUMENTS

| | | | |
|---|---|---|---|
| 5,535,816 A | 7/1996 | Ishida | |
| 5,724,818 A | 3/1998 | Iwata et al. | |
| 6,262,357 B1 | 7/2001 | Johnson et al. | |
| 6,686,532 B1 | 2/2004 | Macris | |
| 7,129,640 B2 | 10/2006 | Flower | |
| 7,299,639 B2 | 11/2007 | Leija et al. | |
| 2005/0133875 A1* | 6/2005 | Zhang | 257/390 |
| 2007/0105301 A1* | 5/2007 | Chen et al. | 438/234 |
| 2009/0056345 A1* | 3/2009 | Edwards et al. | 62/3.7 |
| 2010/0257871 A1 | 10/2010 | Venkatasubramanian et al. | |

\* cited by examiner

*Primary Examiner* — John P Dulka
(74) *Attorney, Agent, or Firm* — Gregory J. Albin; Frank D. Cimino

(57) ABSTRACT

A thermoelectric device is disclosed which includes metal thermal terminals protruding from a top surface of an IC, connected to vertical thermally conductive conduits made of interconnect elements of the IC. Lateral thermoelectric elements are connected to the vertical conduits at one end and heatsinked to the IC substrate at the other end. The lateral thermoelectric elements are thermally isolated by interconnect dielectric materials on the top side and field oxide on the bottom side. When operated in a generator mode, the metal thermal terminals are connected to a heat source and the IC substrate is connected to a heat sink. Thermal power flows through the vertical conduits to the lateral thermoelectric elements, which generate an electrical potential. The electrical potential may be applied to a component or circuit in the IC. The thermoelectric device may be integrated into an IC without adding fabrication cost or complexity.

20 Claims, 10 Drawing Sheets

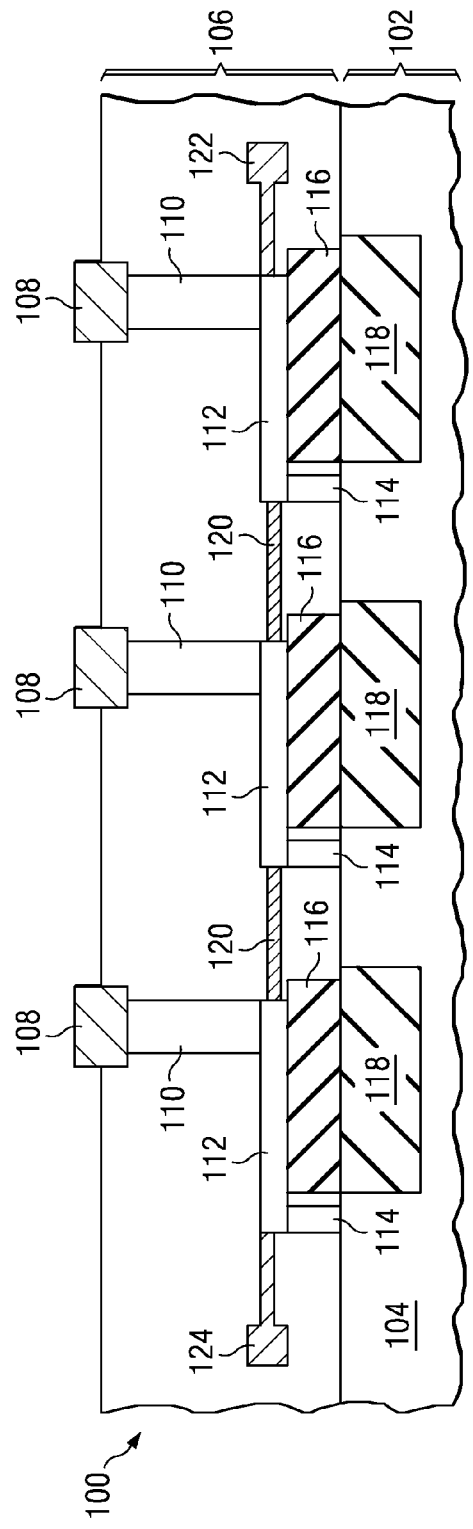
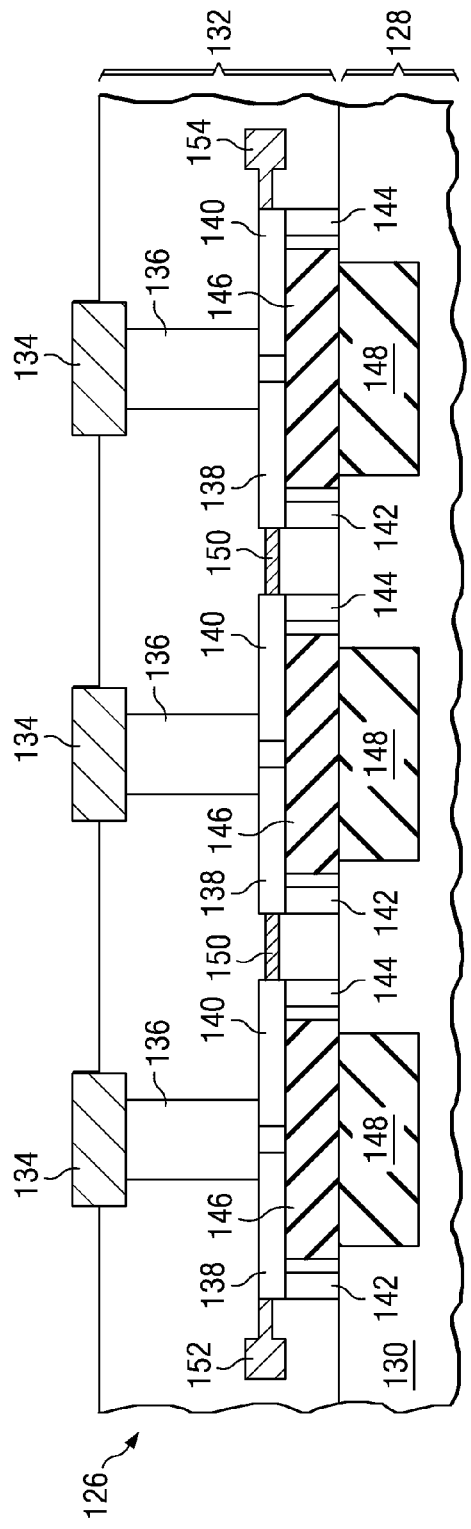
FIG. 1A
FIG. 1B

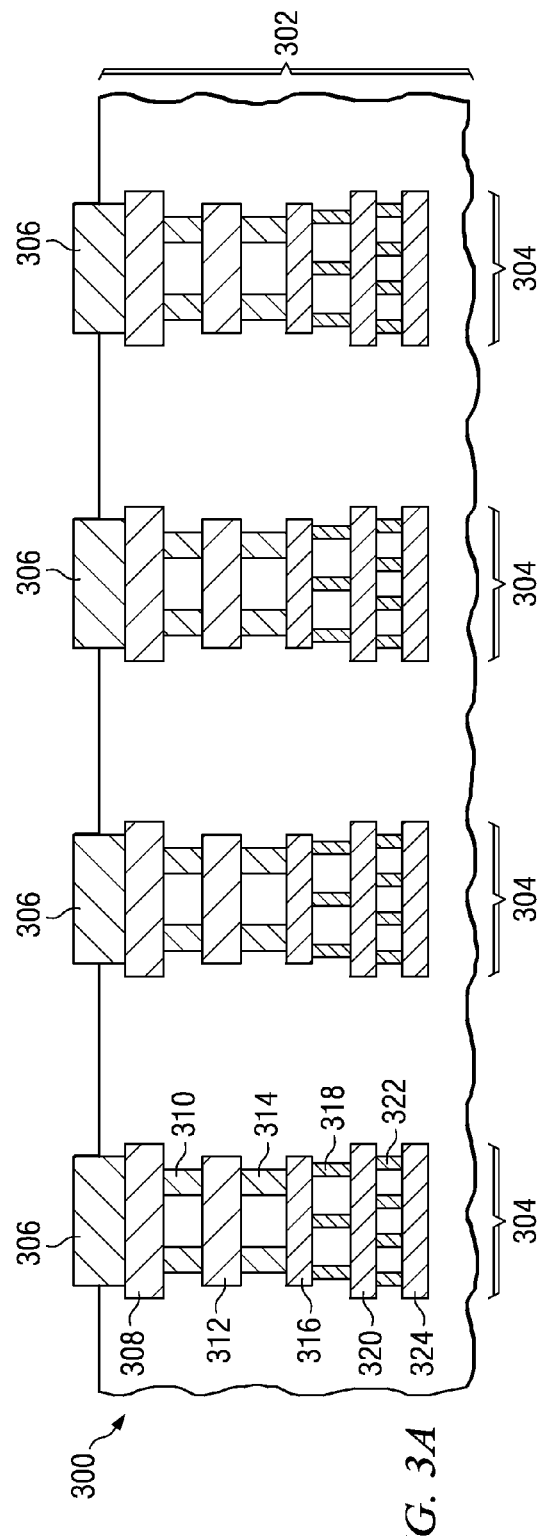
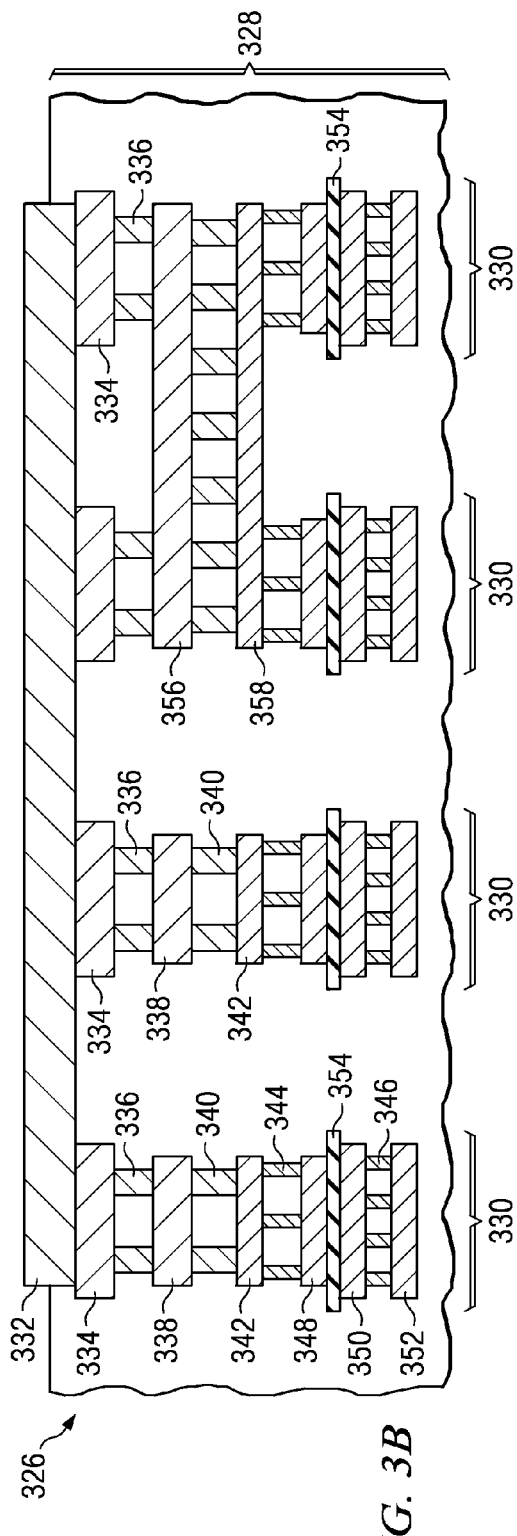
FIG. 3A
FIG. 3B

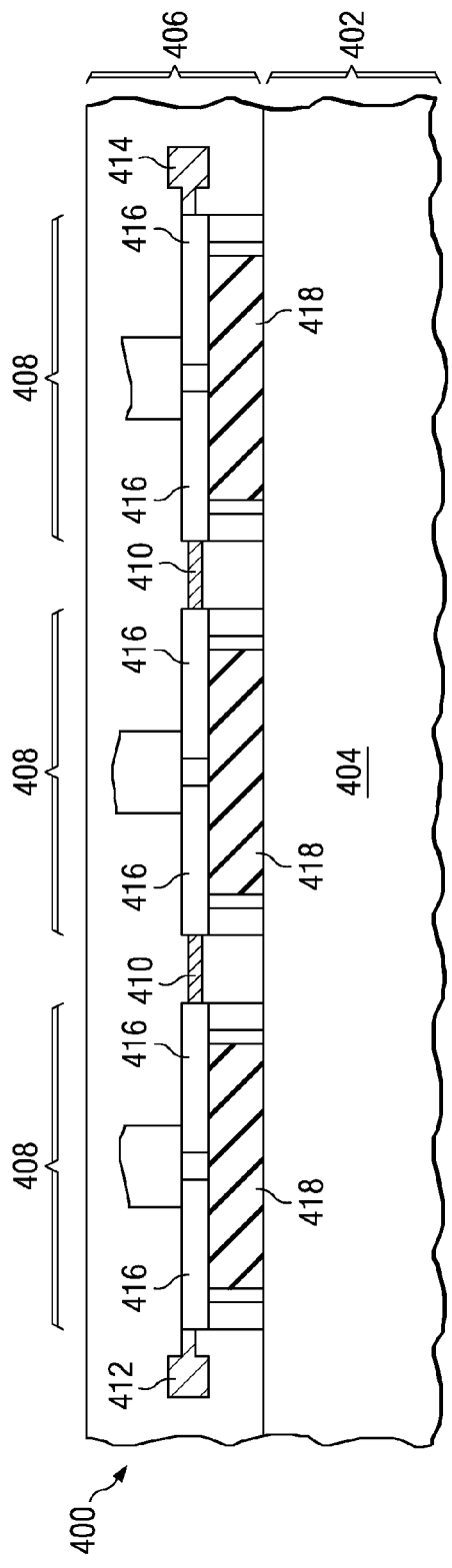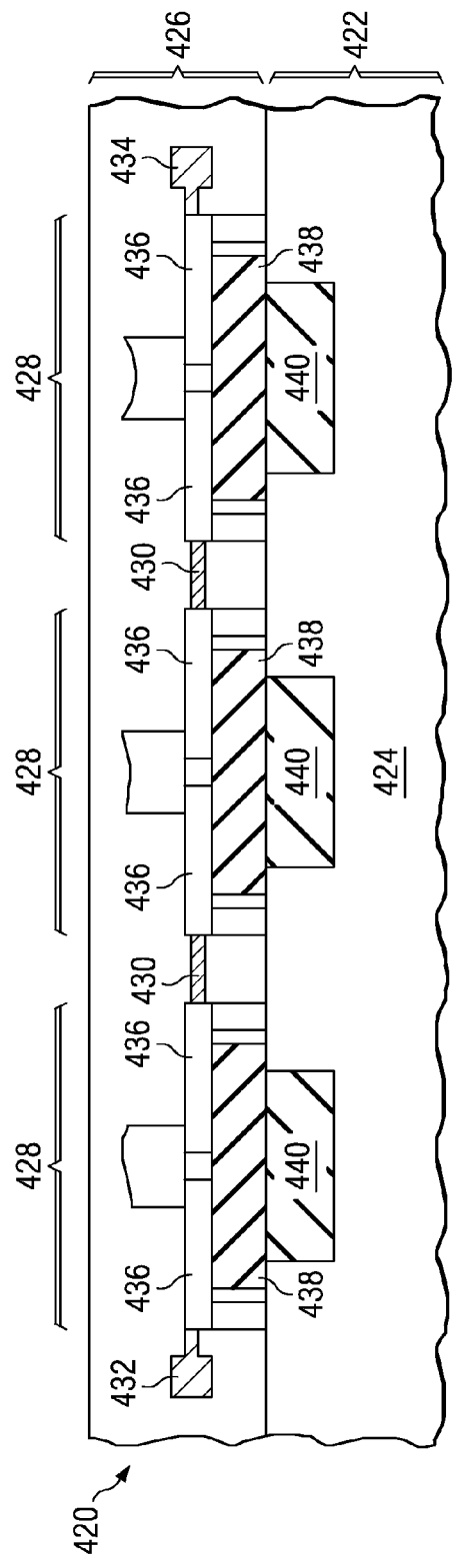

VERTICAL THERMOELECTRIC STRUCTURES

This application is a division of application Ser. No. 12/544,548, filed Aug. 20, 2009, which claims the benefit of Provisional Application No. 61/090,312 filed Aug. 20, 2008, the entireties of which are incorporated herein by reference.

BACKGROUND

This invention relates to the field of integrated circuits. More particularly, this invention relates to vertical thermoelectric structures in integrated circuits.

Thermoelectric devices may function in several modes, for example, a generator mode, a cooler mode, a heater mode, or a temperature sensor mode. Thermoelectric devices may be included in an integrated circuit (IC), most commonly to provide electrical power for a circuit in the IC, to cool a component in the IC, or to sense the temperature of a region in the IC. Integrating a thermoelectric device into an IC may be accomplished by adding process steps to the fabrication process sequence for the IC to form the thermoelectric device elements, resulting in undesirable increased manufacturing costs, or by using the existing IC process flow sequence to form the thermoelectric device elements, which typically results in less than optimum performance of the thermoelectric device.

SUMMARY

The invention provides a thermoelectric device and method for its manufacture.

In a described example implementation, the thermoelectric device includes metal thermal terminals, such as copper or aluminum pads, at a top end connected to vertical thermally conductive conduits formed of horizontal and vertical metal interconnect elements, such as are found in an integrated circuit (IC). Lateral thermoelectric elements are thermally connected to the vertical thermally conductive conduits at one end and heatsinked to a silicon substrate at the other end. The vertical thermally conductive conduits are thermally isolated by dielectric insulator materials. The lateral thermoelectric elements are thermally isolated by interconnect dielectric materials on a top side and thick silicon dioxide on a bottom side. Additional thermally insulating elements may be added between the lateral thermoelectric elements and the silicon substrate to increase an efficiency of the thermoelectric device.

The disclosed thermoelectric device may be integrated into an IC without adding fabrication cost or complexity

BRIEF DESCRIPTION OF THE DRAWINGS

FIGS. 1A and 1B are cross-sectional views of integrated circuits (ICs) including thermoelectric structures in accordance with principles of the invention.

FIGS. 3A and 3B are cross-sectional views of example embodiments including thermally conductive conduits in accordance with principles of the invention.

FIGS. 4A and 4B are cross-sectional views of example embodiments including thermal isolation of lateral thermoelectric elements from silicon substrates.

DETAILED DESCRIPTION OF EXAMPLE EMBODIMENTS

Figure 2A:
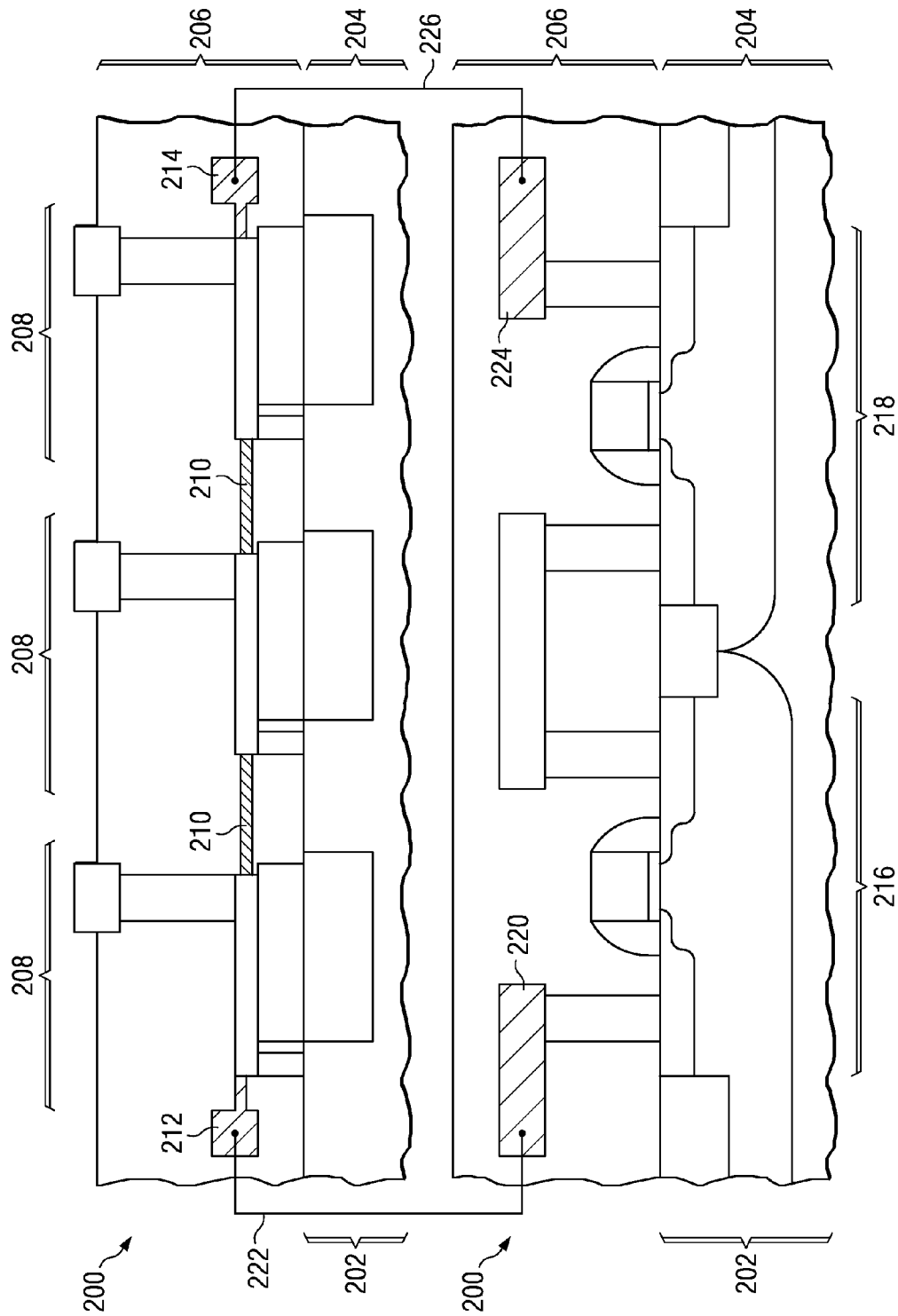
FIGS. 2A and 2B are cross-sectional views of ICs illustrating embodiments of the invention electrically connected for the purpose of providing electrical power to the circuits.

"Thermal contact" between two elements is used herein to mean that an interface between the two elements has a thermal impedance less than $1.4 \cdot 10^{-4}$ cm$^2$ deg C./watt between −55 C and 300 C. Similarly, "thermally connected" in reference to two elements is used to mean that an interface between the two elements has a thermal impedance less than $1.4 \cdot 10^{-4}$ cm$^2$ deg C./watt between −55 C and 300 C.

In described example implementations, a thermoelectric device in an integrated circuit (IC) includes metal thermal terminals, such as copper or aluminum pads or bondpads connected to copper or aluminum interconnect elements, connected to vertical thermally conductive conduits formed of interconnect elements. Lateral thermoelectric elements, which function as Seebeck or Peltier elements, are thermally connected to the vertical thermally conductive conduits at one end and thermally connected to silicon thermal terminals, which are part of the IC substrate, at another end. The vertical thermally conductive conduits are thermally isolated by dielectric insulator materials in interconnect levels. The lateral thermoelectric elements are thermally isolated by interconnect dielectric materials on a top side and field oxide on a bottom side. Additional dielectric elements may be added to a thermal path between the lateral thermoelectric elements and the IC substrate to increase an efficiency of the thermoelectric device.

When operated in one variation of a generator mode, the metal thermal terminals at the top surface of the IC are thermally connected to a heat source and the IC substrate is connected to a heat sink. Thermal power flows from the metal terminals through the vertical thermally conductive conduits to a hot terminal of the Seebeck elements, causing a temperature difference between a hot end and a cold end of the Seebeck elements, which in turns generates an electrical potential between the hot end and the cold end of the Seebeck elements. The electrical potential may be applied to a component or circuit in the IC.

The thermoelectric device may be integrated into an IC without adding fabrication cost or complexity.

FIG. 1A shows an IC 100 formed on a substrate 102 which includes a single crystal silicon top layer 104. An interconnect region 106 including metal interconnect elements and dielectric material is formed on a top surface of the silicon layer 104. The IC 100 includes a first example type thermoelectric device having a set of thermoelectric cells, electrically connected in series. Each cell includes a metal thermal terminal 108 (for example, a copper or aluminum pad or a bondpad connected to a copper or aluminum interconnect element) at a top surface of the interconnect region 106. Each terminal 108 is thermally connected to an upper end of a vertically extending thermally conductive conduit 110 in the interconnect region 106. A lower end of each conduit 110 is thermally connected at a first end of a lateral thermoelectric element 112 fabricated primarily of polycrystalline silicon (i.e., polysilicon), or of metal, such as aluminum. A second end of each lateral thermoelectric element 112 is thermally connected to the silicon layer 104 by a substrate thermal link 114. The lower end of each conduit 110 and the first end and a major portion of each thermoelectric element 112 are thermally isolated from the silicon layer 104 by a field oxide element 116. Additional thermal isolation may be provided by an optional dielectric element 118 formed under each field oxide element 116. The first end of each thermoelectric element 112 is electrically connected to the second end of an adjacent thermoelectric element 112 by a serial electrical link 120, so as to form a chain of thermoelectric cells. The first end of the thermoelectric element 112 in a first cell in the chain is electrically connected to a first power terminal 122. The second end of the thermoelectric element 112 in a last cell in the chain is electrically connected to a second power terminal 124. More than one chain may be connected in parallel to increase a power capacity available to drive a component or circuit in the IC 100.

During operation of the thermoelectric device depicted in FIG. 1A, heat is applied to the thermal terminals 108 and the substrate 102 is thermally connected to a heat sink, causing thermal power to flow from the thermal terminals 108 through the thermally conductive conduits 110. A temperature difference is generated between the first end and the second end of each thermoelectric element 112, producing a cell electrical potential difference between the first end and the second end of each thermoelectric element 112. The electrical links 120 cause a chain electrical potential difference to be produced which is substantially the sum of the cell electrical potential differences. A polarity of the chain electrical potential difference depends on a polarity of the conductivity type of the polysilicon in the thermoelectric elements 112. Those familiar with thermoelectric devices will recognize that the thermal power flow through the thermoelectric device may be reversed, causing the polarity of the chain electrical potential difference to be likewise reversed.

FIG. 1B depicts an IC 126 formed on a substrate 128 which includes a single crystal silicon top layer 130 and an interconnect region 132 formed on a top surface of the silicon layer 130. A second type of thermoelectric device formed according to the invention is fabricated in the IC 126. The thermoelectric device includes a set of thermoelectric cells, electrically connected in series. Each cell includes a metal thermal terminal 134 at a top surface of the interconnect region 132, as described in reference to FIG. 1A. Each thermal terminal 134 is thermally connected to an upper end of a vertically extending thermally conductive conduit 136 in the interconnect region 132. A lower end of each thermally conductive conduit 136 is thermally connected to a first end of a first type lateral thermoelectric element 138 and to a first end of a second type of lateral thermoelectric element 140. In a preferred embodiment, the first type thermoelectric element 138 is formed primarily of n-type polysilicon, and the second type thermoelectric element 140 is formed primarily of p-type polysilicon. A second end of each first type thermoelectric element 138 is thermally connected to the silicon layer 130 by a first substrate thermal link 142. A second end of each second type thermoelectric element 140 is thermally connected to the silicon layer 130 by a second substrate thermal link 144. The lower end of each thermally conductive conduit 136, the first end and a major portion of each first type thermoelectric element 138, and the first end and a major portion of each second type thermoelectric element 140 are thermally isolated from the silicon layer 130 by a field oxide element 146. Additional thermal isolation may be provided by an optional dielectric element 148 formed under each field oxide element 146. The second end of each first type thermoelectric element 138 is electrically connected to the second end of an adjacent second type thermoelectric element 140 by a series electrical link 150, so as to form a chain of thermoelectric cells. The second end of the first type thermoelectric element 138 in a first cell in the chain is electrically connected to a first power terminal 152. The second end of the second type thermoelectric element 140 in a last cell in the chain is electrically connected to a second power terminal 154. More than one chain may be connected in parallel to increase a power capacity available to drive a component or circuit in the IC 126.

During operation of the thermoelectric device depicted in FIG. 1B, heat is applied to the thermal terminals 134 and the substrate 128 is thermally connected to a heat sink, causing thermal power to flow from the thermal terminals 134 through the vertical thermally conductive conduits 136. A positive temperature difference is generated between the first end and the second end of each instance of the first type of lateral thermoelectric element 138 and each instance of the second type of lateral thermoelectric element 140, producing a positive cell electrical potential difference between the second end of each instance of the second type thermoelectric element 140 and the second end of each instance of the first type thermoelectric element 138. The serial electrical links 150 cause a positive chain electrical potential difference to be produced between the second power terminal 154 and the first power terminal 152 which is substantially the sum of the cell electrical potential differences. Those familiar with thermoelectric devices will recognize that a direction of the thermal power flow through the thermoelectric device may be reversed, causing a polarity of the chain electrical potential difference to be likewise reversed.

Figure 2B:
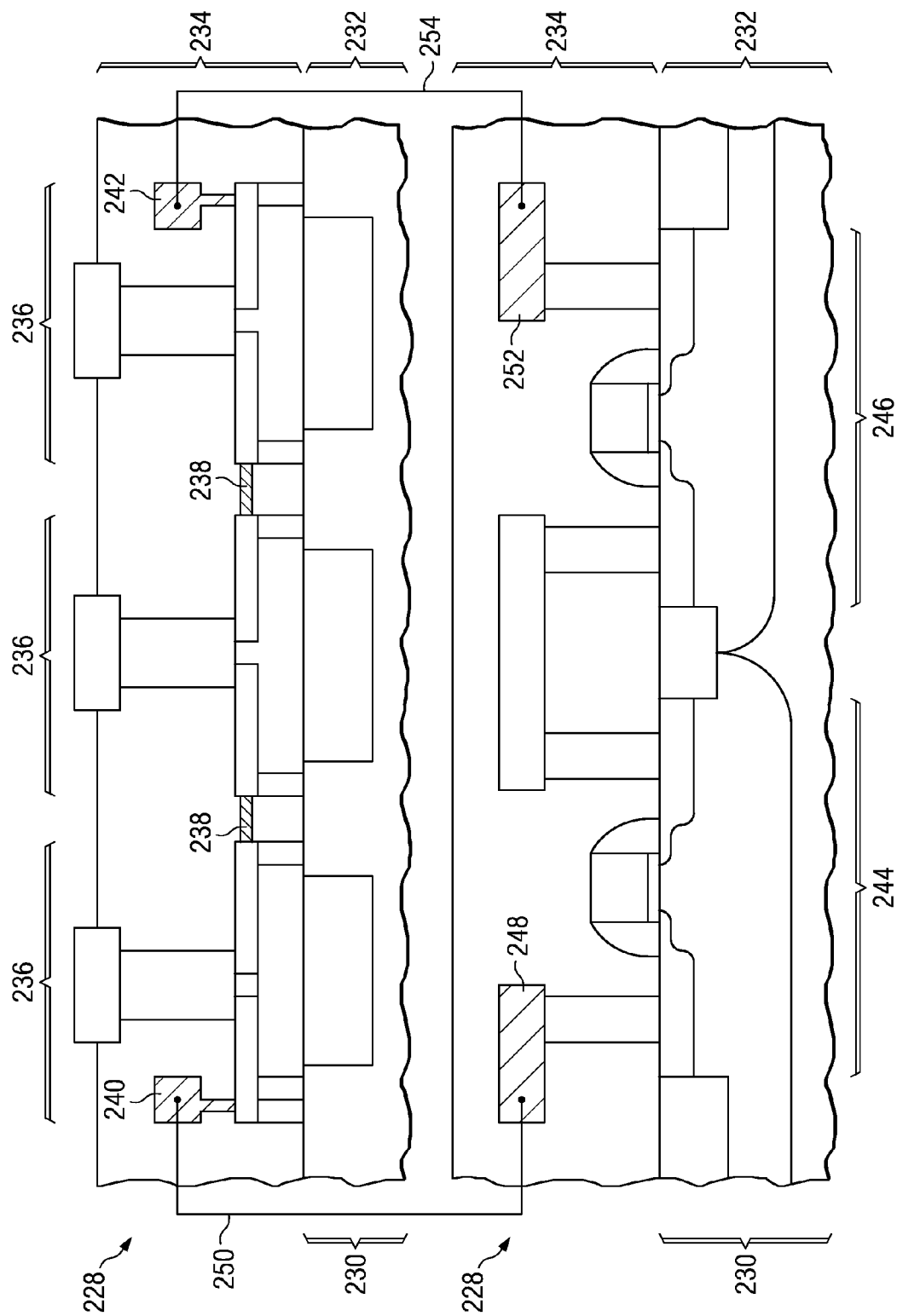

FIGS. 2A and 2B illustrate embodiments of thermoelectric structures electrically connected to IC circuits for the purpose of providing electrical power to the circuits.

FIG. 2A shows an IC 200 formed on a substrate 202 which includes a single crystal silicon top layer 204. An interconnect region 206 including metal interconnect elements and dielectric material is formed on a top surface of the silicon layer 204. The IC 200 contains an instance of the first type of thermoelectric device, described in reference to FIG. 1A. The thermoelectric device includes thermoelectric cells 208 connected in series by serial electrical links 210 to form a chain of thermoelectric cells. A first cell in the chain is electrically connected to a first power terminal 212, and a last cell in the chain is electrically connected to a second power terminal 214. More than one chain of thermoelectric cells may be connected in parallel to provide more electrical power. The IC 200 also includes a circuit, as exemplified by a complementary metal oxide semiconductor (CMOS) buffer which includes an n-channel metal oxide semiconductor (NMOS) transistor 216 in series with a p-channel metal oxide semiconductor (PMOS) transistor 218. The first power terminal 212 is electrically connected to an NMOS source terminal 220 of the NMOS transistor 216, as schematically depicted in FIG. 2A by a first connection element 222. Similarly, the second power terminal 214 is electrically connected to a PMOS source terminal 224 of the PMOS transistor 218, as schematically depicted in FIG. 2A by a second connection element 226.

During operation of the thermoelectric device of FIG. 2A, heat is applied to thermal terminals in the thermoelectric device and the IC substrate 202 is thermally connected to a heat sink, causing an electric potential to be generated between the first power terminal 212 and the second power terminal 214, as described in reference to FIG. 1A. Electrical power flows from the thermoelectric device through the first connection element 222 and second connection element 226 to the circuit in the IC 200, represented by the serially connected NMOS transistor 216 and PMOS transistor 218. Those familiar with thermoelectric devices and electrical circuits will recognize that a direction of the thermal power flow through the thermoelectric device may be reversed, and connections to the source terminals 220, 224 of the NMOS and PMOS transistors, respectively, may be reversed, maintaining a desired polarity of electrical power provided to the circuit in the IC 200.

Referring to FIG. 2B, an IC 228 is formed on a substrate 230 which includes a single crystal silicon top layer 232. An interconnect region 234 including metal interconnect elements and dielectric material is formed on a top surface of the single crystal silicon layer 232. The IC 228 contains an instance of the second type of thermoelectric device, as described in reference to FIG. 1B. The thermoelectric device includes thermoelectric cells 236 connected in series by serial electrical links 238 to form a chain of thermoelectric cells. A first cell in the chain is electrically connected to a first power terminal 240, and a last cell in the chain is electrically connected to a second power terminal 242. More than one chain of thermoelectric cells may be connected in parallel to provide more electrical power. The IC 228 also includes a circuit, as exemplified by a CMOS buffer which includes an NMOS transistor 244 in series with a PMOS transistor 246. The first power terminal 240 is electrically connected to an NMOS source terminal 248 of the NMOS transistor 244, as schematically depicted in FIG. 2B by a first connection element 250. Similarly, the second power terminal 242 is electrically connected to a PMOS source terminal 252 of the PMOS transistor 246, as schematically depicted in FIG. 2B by a second connection element 254.

During operation of the thermoelectric device depicted in FIG. 2B, heat is applied to thermal terminals in the thermoelectric device and the IC substrate 230 is thermally connected to a heat sink, causing an electric potential to be generated between the first power terminal 240 and the second power terminal 242, as described in reference to FIG. 1B. Electrical power flows from the thermoelectric device through the first connection element 250 and second connection element 254 to the circuit in the IC 228, represented by the serially connected NMOS transistor 244 and PMOS transistor 246. Those familiar with thermoelectric devices and electrical circuits will recognize that a direction of the thermal power flow through the thermoelectric device may be reversed, and connections to the source terminals 248, 252 of the NMOS and PMOS transistors, respectively, may be reversed, maintaining a desired polarity of electrical power provided to the circuit in the IC 228.

FIGS. 3A and 3B illustrate ICs with vertical thermally conductive conduits formed according to various embodiments.

Referring to FIG. 3A, an IC 300 includes an interconnect region 302 containing metal interconnect elements and dielectric material and discrete vertically extending thermally conductive conduits 304 formed according to a first embodiment of the vertical thermally conductive conduit. Each discrete vertical thermally conductive conduit includes a metal thermal terminal 306 at a top surface of the IC 300, as described in reference to FIG. 1A. The thermal terminal 306 in each discrete thermally conductive conduit 304 is not directly electrically connected to another metal thermal terminal in another discrete vertical thermally conductive conduit 304. In a preferred embodiment, the thermal terminal 306 is formed concurrently with copper interconnects which are commonly added to top surfaces of silicon wafers containing ICs. The thermal terminal 306 is connected to a first horizontal metal interconnect element 308, commonly copper, but possibly aluminum or other metal or stack of metals. In a preferred embodiment, the first interconnect element 308 is formed concurrently with other horizontal metal interconnect elements in the IC 300.

The first interconnect element 308 is connected to a first set of vertical metal interconnect elements 310, for example metal vias, which are commonly copper, but possibly aluminum or tungsten, or other metal or stack of metals. In a preferred embodiment, the first set of interconnect elements 310 is formed concurrently with other vertical metal interconnect elements in the IC 300. The first set of interconnect elements 310 is connected to a second horizontal metal interconnect element 312, also typically copper, but possibly aluminum or other metal or stack of metals. In a preferred embodiment, the second interconnect element 312 is formed concurrently with other horizontal metal interconnect elements in the IC 300.

The thermally conductive conduit 304 may contain additional vertical metal interconnect elements, as depicted by vertical elements 314, 318, 322, and additional horizontal metal interconnect elements, as depicted by horizontal elements 316, 320, 324. Each set of metal interconnect elements is connected to the set that is vertically adjacent to it. A lowest horizontal metal interconnect element 324 in the thermally conductive conduit 304 is preferably immediately above lateral thermoelectric elements (not shown in FIG. 3A). In a preferred embodiment, each set of metal interconnect elements in the thermally conductive conduit 304 is formed concurrently with other metal interconnect elements in the IC 300. Vertical thermal conductivity in the thermally conductive conduit 304 may be increased by forming the horizontal metal elements contained in the thermally conductive conduit 304 wider and by increasing a number of vertical metal elements contained in the thermally conductive conduit 304 at each interconnect level. An advantage of the instant embodiment of the thermally conductive conduit 304 is that direct connections may be formed between each level of metal interconnect elements, thereby increasing a vertical thermal conductivity compared to embodiments which include one or more horizontal gaps between levels of metal interconnect elements. It is within the scope of the instant embodiment to configure metal interconnect elements in other ways to increase the vertical thermal conductivity of the discrete vertical thermally conductive conduit 304.

Referring to FIG. 3B, an IC 326 includes an interconnect region 328 containing metal interconnect elements and dielectric material and connected vertically extending thermally conductive conduits 330 formed according to a second embodiment of the vertical thermally conductive conduit. A shared metal thermal terminal 332 is shared by two or more connected vertical thermally conductive conduits 330, and perhaps all the connected vertical thermally conductive conduits 330 in a thermoelectric device. The second embodiment of the vertical thermally conductive conduit includes vertical and horizontal metal interconnect elements, for example a first set of horizontal metal interconnect elements 334 electrically and thermally connected to the shared metal thermal terminal 332, a first set of vertical metal interconnect elements 336 electrically and thermally connected to the first set of horizontal metal interconnect elements 334, a second set of horizontal metal interconnect elements 338 electrically and thermally connected to the first set of vertical metal interconnect elements 336, a second set of vertical metal interconnect elements 340 electrically and thermally connected to the second set of horizontal metal interconnect elements 338, and a third set of horizontal metal interconnect elements 342 electrically and thermally connected to the second set of vertical metal interconnect elements 340. The connected thermally conductive conduits 330 may contain additional vertical metal interconnect elements, as depicted by vertical elements 344, 346, and additional horizontal metal interconnect elements, as depicted by horizontal elements 348, 350, 352. A lowest interconnect element 352 in the connected thermally conductive conduit 330 is preferably immediately above lateral thermoelectric elements (not shown in FIG. 3B). In a preferred embodiment, each set of metal interconnect elements in the connected thermally conductive conduit 330 is formed concurrently with other metal interconnect elements in the IC 326.

In the example shown in FIG. 3B, an electrically insulating element 354 is formed in each connected vertical thermally conductive conduit 330 between a pair of adjacent metal interconnect elements (for example, between a horizontal metal interconnect element and a set of vertical metal interconnect elements below the horizontal metal interconnect element) to prevent electrical shorting between thermoelectric cells through the shared metal thermal terminal 332. In a preferred embodiment, a thickness of the electrically insulating element 354 is less than 20 nanometers. In ICs which include capacitors formed of metal interconnect elements and capacitor dielectric layers less than 20 nanometers thick, the electrically insulating elements 354 are preferably formed concurrently with the capacitor dielectric layers. Horizontal metal interconnect elements between the shared metal thermal terminal 332 and the electrically insulating element 354 may be shared among one or more connected vertical thermally conductive conduit 330, as depicted by a first shared horizontal metal interconnect element 356 and a second shared horizontal metal interconnect element 358. An instance of the electrically insulating element 354 may be shared among one or more connected vertical thermally conductive conduits 330.

FIGS. 4A and 4B illustrate example embodiments including thermal isolation of lateral thermoelectric elements from silicon substrates.

FIG. 4A shows an IC 400 formed in a substrate 402 which includes a single crystal silicon top layer 404. An interconnect region 406 including metal interconnect elements and dielectric material is formed on a top surface of the single crystal silicon layer 404. The IC 400 contains an instance of the second type of thermoelectric device, as described in reference to FIG. 1B. The thermoelectric device includes thermoelectric cells 408 connected in series by serial electrical links 410 to form a chain of thermoelectric cells. A first cell in the chain is electrically connected to a first power terminal 412. A last cell in the chain is electrically connected to a second power terminal 414. Lateral thermoelectric elements 416 in the thermoelectric cells 408 are thermally isolated from the silicon top layer 404 by an element of field oxide 418, typically silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP).

FIG. 4B shows an IC 420 formed in a substrate 422 which includes a single crystal silicon top layer 424. An interconnect region 426 including metal interconnect elements and dielectric material is formed on a top surface of the single crystal silicon layer 424. The IC 420 contains an instance of the second type of thermoelectric device, as described in reference to FIG. 1B. The thermoelectric device includes thermoelectric cells 428 connected in series by serial electrical links 430 to form a chain of thermoelectric cells. A first cell in the chain is electrically connected to a first power terminal 432. A last cell in the chain is electrically connected to a second power terminal 434. Lateral thermoelectric elements 436 in the thermoelectric cells 428 are thermally isolated from the silicon top layer 424 by an element of field oxide 438, augmented by thermally insulating sub-field-oxide elements 440 formed in the silicon substrate 424. The thermally insulating sub-field-oxide elements 440 may be elements of deep trench isolation which are formed by etching trenches between 1 and 5 microns deep in the silicon top layer 424 and filling the trenches with silicon dioxide. Forming the thermally insulating sub-field-oxide elements 440 of other thermally insulating elements, such as regions of low-k dielectric material or air voids, is within the scope of the invention.

FIGS. 5A-5E show ICs with various implementations of thermal and electrical connections between lateral thermoelectric elements in the first type of thermoelectric device, silicon top layers in substrates of the ICs and serial electrical links to adjacent lateral thermoelectric elements.

Figure 5C:
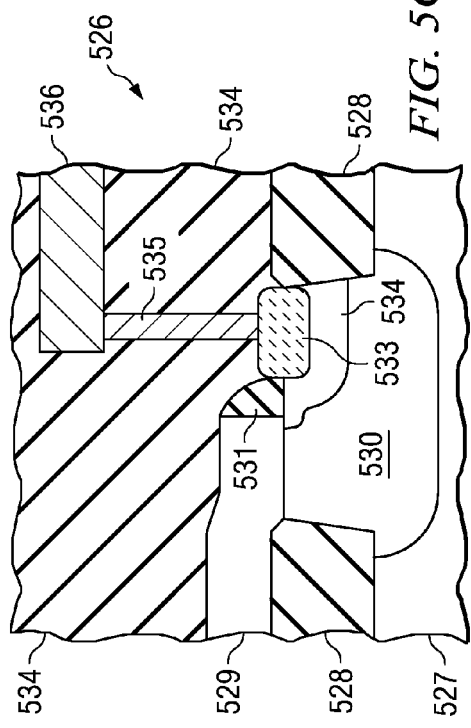
FIGS. 5A-5E are cross-sectional views of embodiments including thermal and electrical connections between lateral thermoelectric elements in a first type of thermoelectric device, silicon top layers in substrates of the ICs and serial electrical links to adjacent lateral thermoelectric elements.
Figure 5D:
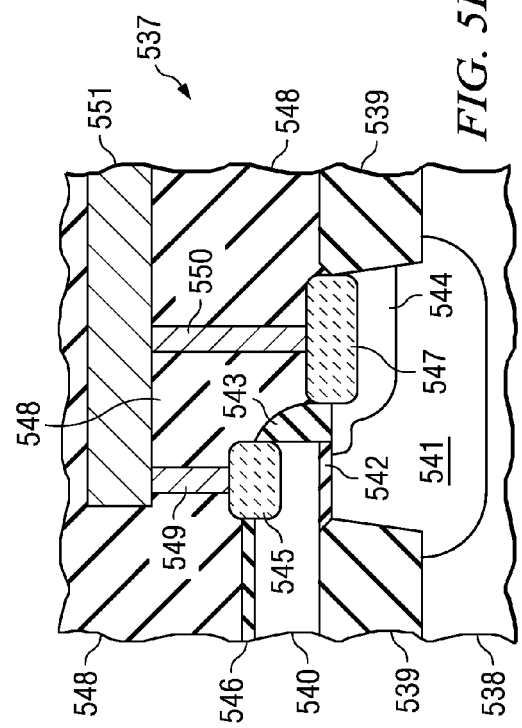
Figure 5A:
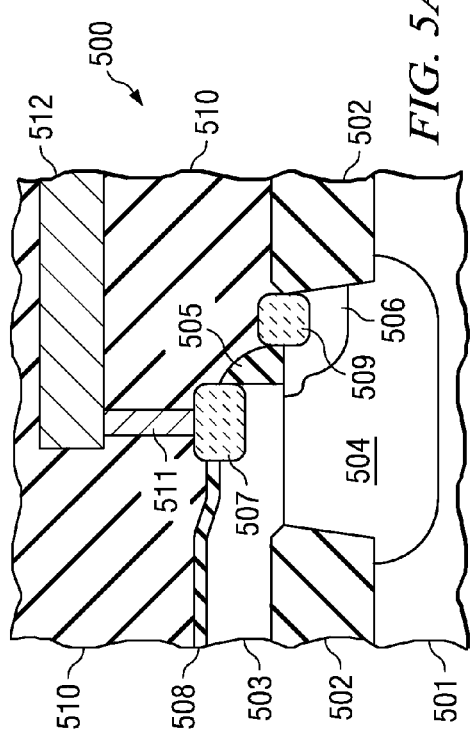

In FIG. 5A, an IC 500 includes a silicon top layer 501 of a substrate of the IC 500. Elements of field oxide 502 provide thermal isolation between the silicon top layer 501 and a thermoelectric element 503. An n-type isolation well 504 is formed in the silicon top layer 501 between the elements of field oxide 502 to provide electrical isolation of the thermoelectric element 503 from the substrate of the IC 500. An end of the thermoelectric element 503 contacts the silicon top layer 501 between the elements of field oxide 502. An optional sidewall spacer 505 may be formed on lateral surfaces of the thermoelectric element 503. An optional n-type diffused region 506 may be formed in the n-type isolation well 504, possibly concurrently with n-type source and drain regions of NMOS transistors in the IC 500. An optional region of thermoelectric element metal silicide 507 (for example, nickel silicide, cobalt silicide, titanium silicide or platinum silicide) may be formed on a top surface of the thermoelectric element 503 using known methods. A silicide block dielectric layer 508 may be patterned on a top surface of the thermoelectric element 503 to define an area for metal silicide; a layer of refractory metal (such as nickel, cobalt, titanium or platinum) may be deposited on the top surface of the thermoelectric element 503 with an optional cap layer; the IC 500 may be heated to react a portion of the refractory metal with exposed silicon in the thermoelectric element 503; unreacted metal may be removed from an existing surface of the IC 500 (such as by exposing the IC 500 to wet etchants including a mixture of sulfuric acid and hydrogen peroxide, followed by an optional silicide anneal process to convert the metal silicide to a desired phase, such as NiSi, $CoSi_2$, $TiSi_2$, or PtSi). An optional region of substrate metal silicide 509 may be formed on a top surface of the silicon top layer 501 between the elements of field oxide 502, concurrently with the region of thermoelectric element metal silicide 507. A dielectric layer 510 is formed on an existing top surface of the IC 500 using known methods, possibly by deposition in two or more separate process operations. A vertical metal interconnect element 511 is formed in the dielectric layer 510 using known methods, and preferably concurrently with other vertical metal interconnect elements in the IC 500, to make electrical and thermal contact to the thermoelectric element 503, through the optional region of thermoelectric element metal silicide 507, if present. A horizontal metal interconnect element 512 is formed in the dielectric layer 510 using known methods, and preferably concurrently with other horizontal metal interconnect elements in the IC 500, to make electrical and thermal contact to the vertical metal interconnect element 511. The horizontal metal interconnect element 512 is connected to another thermoelectric element in an adjacent thermoelectric cell, not shown in FIG. 5A for clarity, in the IC 500.

Figure 5B:
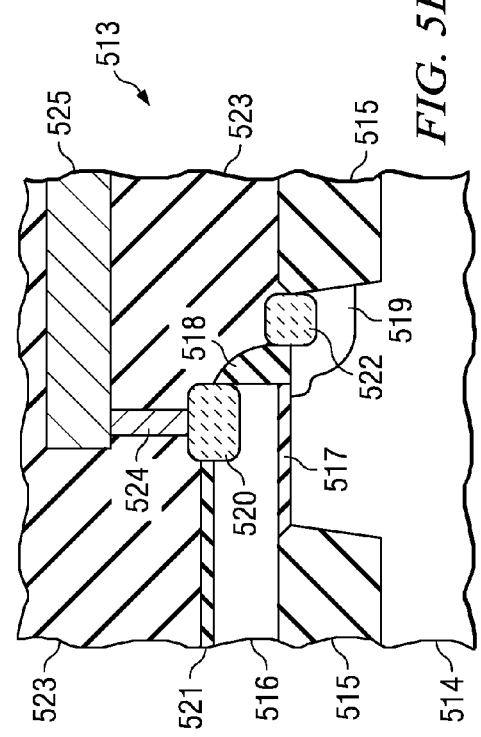

In FIG. 5B, an IC 513 includes a silicon top layer 514 of a substrate of the IC 513. Elements of field oxide 515 provide thermal isolation between the silicon top layer 514 and a thermoelectric element 516. An end of the thermoelectric element 516 makes thermal contact with the silicon top layer 514 through a dielectric layer 517, preferably silicon dioxide, nitrogen doped silicon dioxide, silicon oxy-nitride, hafnium oxide, layers of silicon dioxide and silicon nitride, or other insulating material, and preferably less than 5 nanometers thick. Furthermore, the dielectric layer 517 is preferably formed concurrently with gate dielectric layers in MOS transistors in the IC 513. An optional sidewall spacer 518 may be formed on lateral surfaces of the thermoelectric element 516. An optional n-type diffused region 519 may be formed in the silicon top layer 514, possibly concurrently with n-type source and drain regions of NMOS transistors in the IC 513. An optional region of thermoelectric element metal silicide 520, as described in reference to FIG. 5A, may be formed on a top surface of the thermoelectric element 516 in an open patterned area in a silicide block 521 layer on the top surface of the thermoelectric element 516. An optional region of substrate metal silicide 522 may be formed on a top surface of the silicon top layer 514 between the elements of field oxide 515, concurrently with the region of thermoelectric element metal silicide 520. A dielectric layer 523 is formed on an existing top surface of the IC 513 using known methods as described in reference to FIG. 5A. A vertical metal interconnect element 524 is formed in the dielectric layer 523 using known methods, and preferably concurrently with other vertical metal interconnect elements in the IC 513, to make electrical and thermal contact to the thermoelectric element 516, through the optional region of thermoelectric element metal silicide 520, if present. A horizontal metal interconnect element 525 is formed in the dielectric layer 523 using known methods, and preferably concurrently with other horizontal metal interconnect elements in the IC 513, to make electrical and thermal contact to the vertical metal interconnect element 524. The horizontal metal interconnect element 525 is connected to another thermoelectric element in an adjacent thermoelectric cell, not shown in FIG. 5B for clarity, in the IC 513.

In FIG. 5C, an IC 526 includes a silicon top layer 527 of a substrate of the IC 526. Elements of field oxide 528 provide thermal isolation between the silicon top layer 527 and a thermoelectric element 529. An n-type isolation well 530 is formed in the silicon top layer 527 between the elements of field oxide 528 to provide electrical isolation of the thermoelectric element 529 from the substrate of the IC 526. An end of the thermoelectric element 529 contacts the silicon top layer 527 between the elements of field oxide 528. An optional sidewall spacer 531 may be formed on lateral surfaces of the thermoelectric element 529. An optional n-type diffused region 532 may be formed in the n-type isolation well 530, possibly concurrently with n-type source and drain regions of NMOS transistors in the IC 526. An optional region of substrate metal silicide 533 is preferably formed on a top surface of the silicon top layer 527 between the elements of field oxide 528, as described in reference to FIG. 5A. A dielectric layer 534 is formed on an existing top surface of the IC 526 using known methods as described in reference to FIG. 5A. A vertical metal interconnect element 535 is formed in the dielectric layer 520 using known methods, and preferably concurrently with other vertical metal interconnect elements in the IC 526, to make electrical and thermal contact to the n-type isolation well 530, through the optional region of substrate metal silicide 533, if present. A horizontal metal interconnect element 536 is formed in the dielectric layer 534 using known methods, and preferably concurrently with other horizontal metal interconnect elements in the IC 526, to make electrical and thermal contact to the vertical metal interconnect element 535. The horizontal metal interconnect element 536 is connected to another thermoelectric element in an adjacent thermoelectric cell, not shown in FIG. 5C for clarity, in the IC 526.

In FIG. 5D, an IC 537 includes a silicon top layer 538 of a substrate of the IC 537. Elements of field oxide 539 provide thermal isolation between the silicon top layer 538 and a thermoelectric element 540. An n-type isolation well 541 is formed in the silicon top layer 538 between the elements of field oxide 539 to provide electrical isolation of the thermoelectric element 540 from the substrate of the IC 537. An end of the thermoelectric element 540 makes thermal contact with the silicon top layer 538 through a dielectric layer 542 as described in reference to FIG. 5B. Furthermore, the dielectric layer 542 is preferably formed concurrently with gate dielectric layers in MOS transistors in the IC 537. An optional sidewall spacer 543 may be formed on lateral surfaces of the thermoelectric element 540. An optional n-type diffused region 544 may be formed in the silicon top layer 538, possibly concurrently with n-type source and drain regions of NMOS transistors in the IC 537. An optional region of thermoelectric element metal silicide 545, as described in reference to FIG. 5A, may be formed on a top surface of the thermoelectric element 540 in an open patterned area in a silicide block layer 546 on the top surface of the thermoelectric element 540. An optional region of substrate metal silicide 547 may be formed on a top surface of the silicon top layer 538 between the elements of field oxide 539, concurrently with the region of thermoelectric element metal silicide 545. A dielectric layer 548 is formed on an existing top surface of the IC 537 using known methods as described in reference to FIG. 5A. A first vertical metal interconnect element 549 is formed in the dielectric layer 548 using known methods, and preferably concurrently with other vertical metal interconnect elements in the IC 537, to make electrical and thermal contact to the thermoelectric element 540, through the optional region of thermoelectric element metal silicide 545, if present. A second vertical metal interconnect element 550 is formed in the dielectric layer 548, preferably concurrently with the first vertical metal interconnect element 549, to make electrical and thermal contact to the silicon top layer 538, through the optional region of substrate metal silicide 547, if present. A horizontal metal interconnect element 551 is formed in the dielectric layer 548 using known methods, and preferably concurrently with other horizontal metal interconnect elements in the IC 537, to make electrical and thermal contact to the first vertical metal interconnect element 549 and the second vertical metal interconnect element 550. The horizontal metal interconnect element 551 is connected to another thermoelectric element in an adjacent thermoelectric cell (not shown in FIG. 5D) in the IC 537.

Figure 5E:
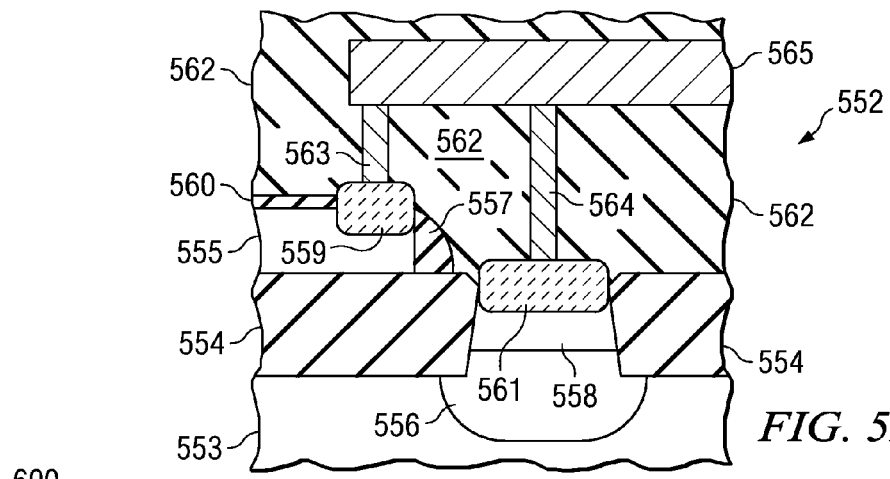

In FIG. 5E, an IC 552 includes a silicon top layer 553 of a substrate of the IC 552. Elements of field oxide 554 provide thermal isolation between the silicon top layer 553 and a thermoelectric element 555. An n-type isolation well 556 is formed in the silicon top layer 553 between the elements of field oxide 554 to provide electrical isolation of the thermoelectric element 555 from the substrate of the IC 552. An optional sidewall spacer 557 may be formed on lateral surfaces of the thermoelectric element 555. An optional n-type diffused region 558 may be formed in the silicon top layer 553, possibly concurrently with n-type source and drain regions of NMOS transistors in the IC 552. An optional region of thermoelectric element metal silicide 559, as described in reference to FIG. 5A, may be formed on a top surface of the thermoelectric element 555 in an open patterned area in a silicide block layer 560 on the top surface of the thermoelectric element 555. An optional region of substrate metal silicide 561 may be formed on a top surface of the silicon top layer 553 between the elements of field oxide 554, concurrently with the region of thermoelectric element metal silicide 559. A dielectric layer 562 is formed on an existing top surface of the IC 552 using known methods as described in reference to FIG. 5A. A first vertical metal interconnect element 563 is formed in the dielectric layer 562 using known methods, and preferably concurrently with other vertical metal interconnect elements in the IC 552, to make electrical and thermal contact to the thermoelectric element 555, through the optional region of thermoelectric element metal silicide 559, if present. A second vertical metal interconnect element 564 is formed in the dielectric layer 562, preferably concurrently with the first vertical metal interconnect element 563, to make electrical and thermal contact to the silicon top layer 553, through the optional region of substrate metal silicide 561, if present. A horizontal metal interconnect element 566 is formed in the dielectric layer 562 using known methods, and preferably concurrently with other horizontal metal interconnect elements in the IC 552, to make electrical and thermal contact to the first vertical metal interconnect element 563 and the second vertical metal interconnect element 564. The horizontal metal interconnect element 566 is connected to another thermoelectric element in an adjacent thermoelectric cell (not shown in FIG. 5E) in the IC 552.

FIGS. 6A-6H show ICs with different examples of thermal and electrical connections between lateral thermoelectric elements in the second type of thermoelectric device, silicon top layers in substrates of the ICs and serial electrical links to adjacent lateral thermoelectric elements.

Figure 6A:
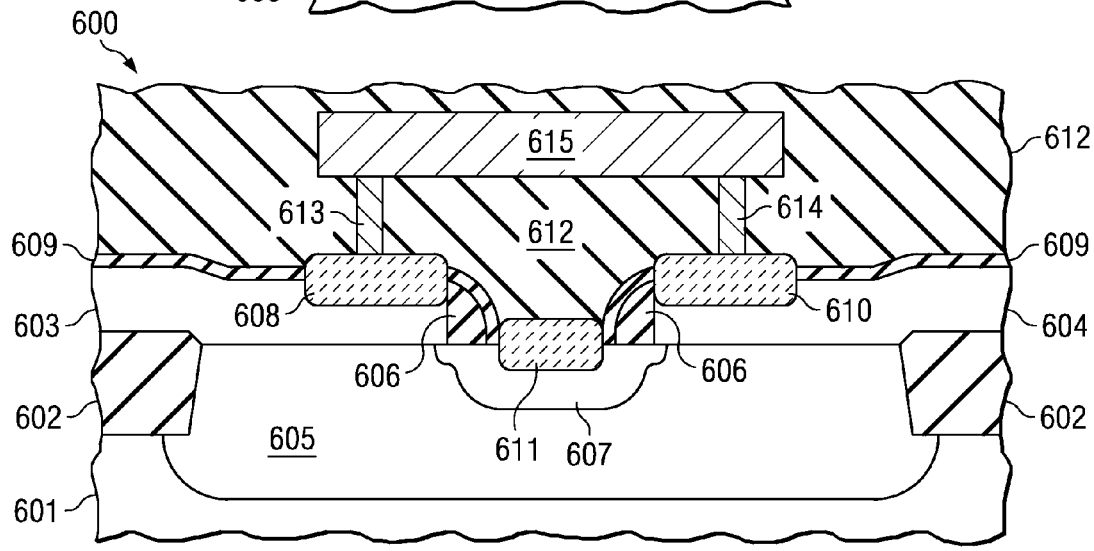
FIGS. 6A-6H are cross-sectional views of embodiments with thermal and electrical connections between lateral thermoelectric elements in a second type of thermoelectric device, silicon top layers in substrates of the ICs and serial electrical links to adjacent lateral thermoelectric elements.

In FIG. 6A, an IC 600 includes a silicon top layer 601 of a substrate of the IC 600. Elements of field oxide 602 provide thermal isolation between the silicon top layer 601 and a first thermoelectric element 603 and a second thermoelectric element 604. An n-type isolation well 605 is formed in the silicon top layer 601 between the elements of field oxide 602 to provide electrical isolation of the first thermoelectric element 603 and the second thermoelectric element 604 from the substrate of the IC 600. An end of the first thermoelectric element 603 and an end of the second thermoelectric element 604 contact the silicon top layer 601 between the elements of field oxide 602. Optional sidewall spacers 606 may be formed on lateral surfaces of the first thermoelectric element 603 and the second thermoelectric element 604. An optional n-type diffused region 607 may be formed in the n-type isolation well 605, possibly concurrently with n-type source and drain regions of NMOS transistors in the IC 600. An optional first region of thermoelectric element metal silicide 608, as described in reference to FIG. 5A, may be formed on a top surface of the first thermoelectric element 603 in an open patterned area in a silicide block layer 609 on the top surface of the first thermoelectric element 603. Similarly, an optional second region of thermoelectric element metal silicide 610 may be formed concurrently with the optional first region of thermoelectric element metal silicide 608 on a top surface of the second thermoelectric element 604 in an open patterned area in the silicide block layer 609 on the top surface of the second thermoelectric element 604. An optional region of substrate metal silicide 611 may be formed on a top surface of the silicon top layer 601 between the elements of field oxide 602, concurrently with the first and second regions of thermoelectric element metal silicide 608, 610. A dielectric layer 612 is formed on an existing top surface of the IC 600 using known methods as described in reference to FIG. 5A. A first vertical metal interconnect element 613 is formed in the dielectric layer 612 using known methods, and preferably concurrently with other vertical metal interconnect elements in the IC 600, to make electrical contact to the first thermoelectric element 603, through the optional first region of thermoelectric element metal silicide 608, if present. A second vertical metal interconnect element 614 is formed in the dielectric layer 612 concurrently with the first vertical metal interconnect element 613, to make electrical contact to the second thermoelectric element 604, through the optional second region of thermoelectric element metal silicide 610, if present. A horizontal metal interconnect element 615 is formed in the dielectric layer 612 using known methods, and preferably concurrently with other horizontal metal interconnect elements in the IC 600, to electrically connect the first vertical metal interconnect element 613 with the second vertical metal interconnect element 614.

Figure 6B:
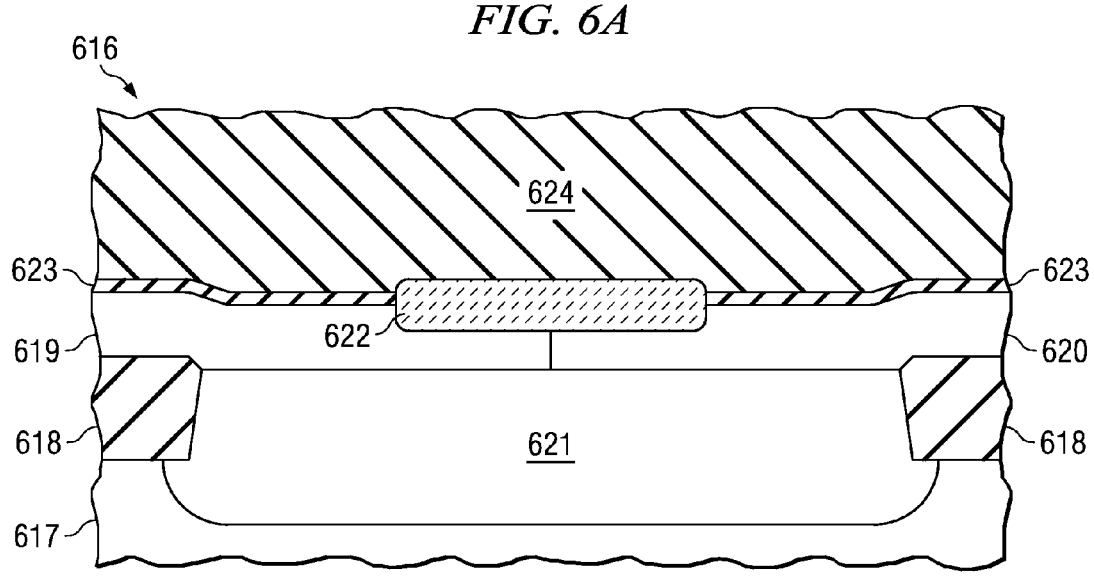

In FIG. 6B, an IC 616 includes a silicon top layer 617 of a substrate of the IC 616. Elements of field oxide 618 provide thermal isolation between the silicon top layer 616 and a first thermoelectric element 619 and a second thermoelectric element 620. An n-type isolation well 621 is formed in the silicon top layer 617 between the elements of field oxide 618 to provide electrical isolation of the first thermoelectric element 619 and the second thermoelectric element 620 from the substrate of the IC 616. An end of the first thermoelectric element 619 and an end of the second thermoelectric element 620 contact the silicon top layer 617 between the elements of field oxide 618. The end of the first thermoelectric element 619 preferably contacts the end of the second thermoelectric element 620. A region of thermoelectric element metal silicide 622, as described in reference to FIG. 5A, may be formed on a top surface of the first thermoelectric element 619 and on a top surface of the second thermoelectric element 620 in an open patterned area in a silicide block layer 623 on the top surface of the first thermoelectric element 619 and on the top surface of the second thermoelectric element 620, so as to electrically connect the first thermoelectric element 619 with the second thermoelectric element 620. A dielectric layer 624 is formed on an existing top surface of the IC 616 using known methods as described in reference to FIG. 5A.

Figure 6C:
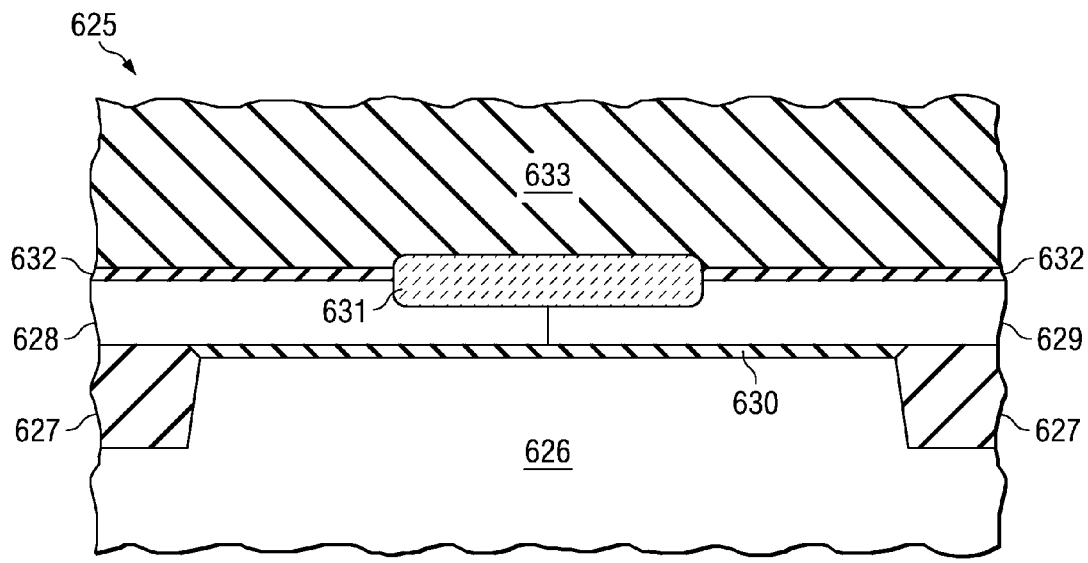

In FIG. 6C, an IC 625 includes a silicon top layer 626 of a substrate of the IC 625. Elements of field oxide 627 provide thermal isolation between the silicon top layer 626 and a first thermoelectric element 628 and a second thermoelectric element 629. An end of the first thermoelectric element 628 and an end of the second thermoelectric element 629 thermally contact the silicon top layer 626 through a dielectric layer 630 as described in reference to FIG. 5B between the elements of field oxide 627. The end of the first thermoelectric element 628 preferably contacts the end of the second thermoelectric element 629. A region of thermoelectric element metal silicide 631, as described in reference to FIG. 5A, may be formed on a top surface of the first thermoelectric element 628 and on a top surface of the second thermoelectric element 629 in an open patterned area in a silicide block layer 632 on the top surface of the first thermoelectric element 628 and on the top surface of the second thermoelectric element 629, so as to electrically connect the first thermoelectric element 628 with the second thermoelectric element 629. A dielectric layer 633 is formed on an existing top surface of the IC 625 using known methods as described in reference to FIG. 5A.

Figure 6D:
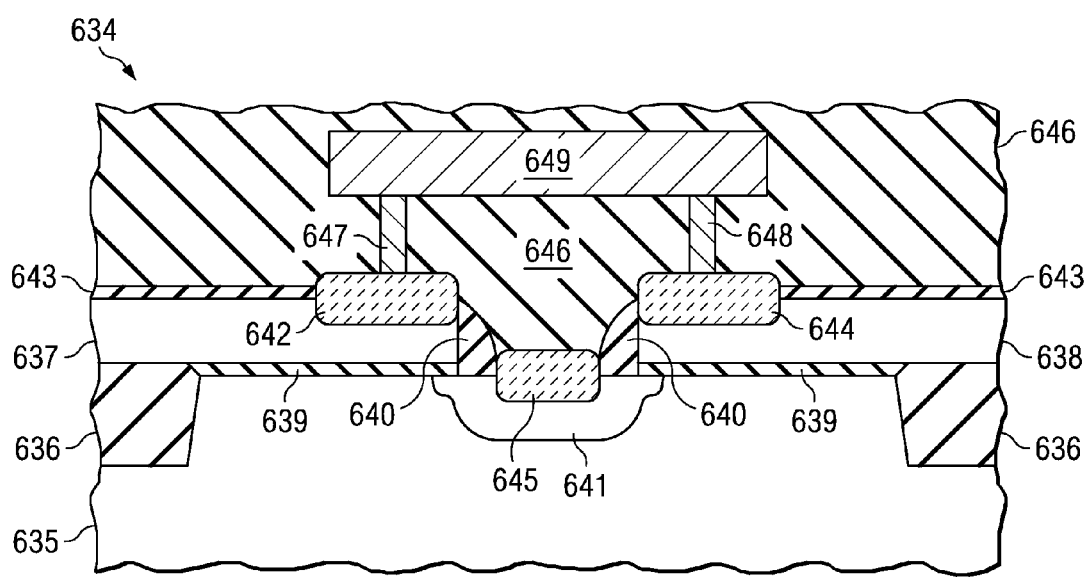

In FIG. 6D, an IC 634 includes a silicon top layer 635 of a substrate of the IC 634. Elements of field oxide 636 provide thermal isolation between the silicon top layer 635 and a first thermoelectric element 637 and a second thermoelectric element 638. An end of the first thermoelectric element 637 and an end of the second thermoelectric element 638 thermally contact the silicon top layer 635 through a dielectric layer 639 as described in reference to FIG. 5B between the elements of field oxide 636. Optional sidewall spacers 640 may be formed on lateral surfaces of the first thermoelectric element 637 and the second thermoelectric element 638. An optional n-type diffused region 641 may be formed in the silicon top layer 635, possibly concurrently with n-type source and drain regions of NMOS transistors in the IC 634. An optional first region of thermoelectric element metal silicide 642, as described in reference to FIG. 5A, may be formed on a top surface of the first thermoelectric element 637 in an open patterned area in a silicide block layer 643 on the top surface of the first thermoelectric element 637. Similarly, an optional second region of thermoelectric element metal silicide 644 may be formed concurrently with the optional first region of thermoelectric element metal silicide 642 on a top surface of the second thermoelectric element 638 in an open patterned area in the silicide block layer 643 on the top surface of the second thermoelectric element 638. An optional region of substrate metal silicide 645 may be formed on a top surface of the silicon top layer 635 between the elements of field oxide 636, concurrently with the first and second regions of thermoelectric element metal silicide 642, 644. A dielectric layer 646 is formed on an existing top surface of the IC 634 using known methods as described in reference to FIG. 5A. A first vertical metal interconnect element 647 is formed in the dielectric layer 646 using known methods, and preferably concurrently with other vertical metal interconnect elements in the IC 634, to make electrical contact to the first thermoelectric element 637, through the optional first region of thermoelectric element metal silicide 642, if present. A second vertical metal interconnect element 648 is formed in the dielectric layer 646 concurrently with the first vertical metal interconnect element 647, to make electrical contact to the second thermoelectric element 638, through the optional second region of thermoelectric element metal silicide 644, if present. A horizontal metal interconnect element 649 is formed in the dielectric layer 646 using known methods, and preferably concurrently with other horizontal metal interconnect elements in the IC 634, to electrically connect the first vertical metal interconnect element 647 with the second vertical metal interconnect element 648.

Figure 6E:
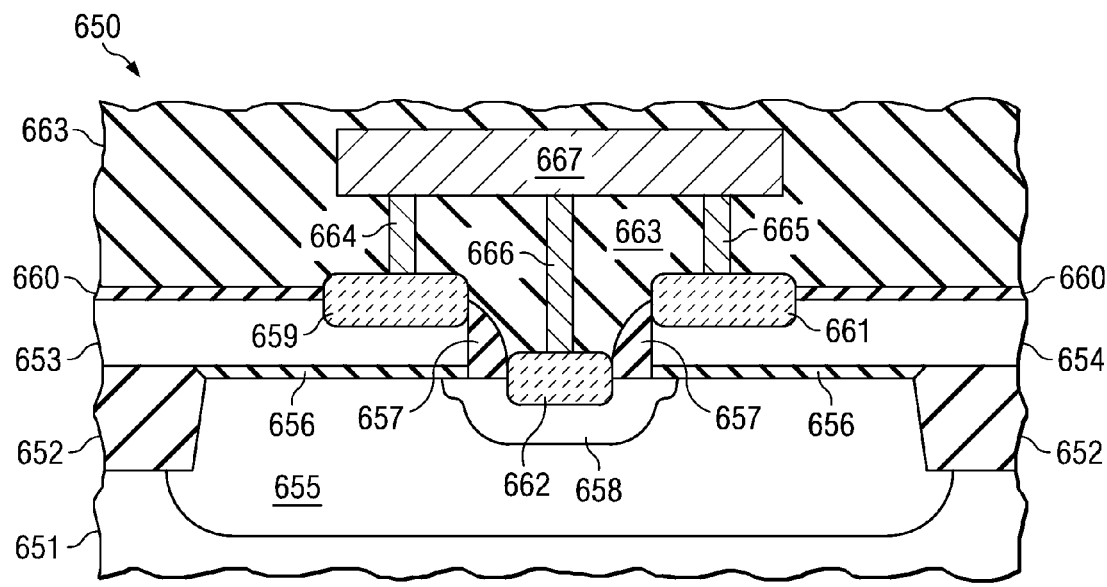

In FIG. 6E, an IC 650 includes a silicon top layer 651 of a substrate of the IC 650. Elements of field oxide 652 provide thermal isolation between the silicon top layer 651 and a first thermoelectric element 653 and a second thermoelectric element 654. An n-type isolation well 655 is formed in the silicon top layer 651 between the elements of field oxide 652 to provide electrical isolation of the first thermoelectric element 653 and the second thermoelectric element 654 from the substrate of the IC 650. An end of the first thermoelectric element 653 and an end of the second thermoelectric element 654 thermally contact the silicon top layer 651 through a dielectric layer 656 as described in reference to FIG. 5B between the elements of field oxide 652. Optional sidewall spacers 657 may be formed on lateral surfaces of the first thermoelectric element 653 and the second thermoelectric element 654. An optional n-type diffused region 658 may be formed in the silicon top layer 651, possibly concurrently with n-type source and drain regions of NMOS transistors in the IC 650. An optional first region of thermoelectric element metal silicide 659, as described in reference to FIG. 5A, may be formed on a top surface of the first thermoelectric element 653 in an open patterned area in a silicide block layer 660 on the top surface of the first thermoelectric element 653. Similarly, an optional second region of thermoelectric element metal silicide 661 may be formed concurrently with the optional first region of thermoelectric element metal silicide 659 on a top surface of the second thermoelectric element 654 in an open patterned area in the silicide block layer 660 on the top surface of the second thermoelectric element 654. An optional region of substrate metal silicide 662 may be formed on a top surface of the silicon top layer 651 between the elements of field oxide 652, concurrently with the first and second regions of thermoelectric element metal silicide 659, 661. A dielectric layer 663 is formed on an existing top surface of the IC 650 using known methods as described in reference to FIG. 5A. A first vertical metal interconnect element 664 is formed in the dielectric layer 663 using known methods, and preferably concurrently with other vertical metal interconnect elements in the IC 650, to make electrical contact to the first thermoelectric element 653, through the optional first region of thermoelectric element metal silicide 659, if present. A second vertical metal interconnect element 665 is formed in the dielectric layer 663 concurrently with the first vertical metal interconnect element 664, to make electrical contact to the second thermoelectric element 654, through the optional second region of thermoelectric element metal silicide 661, if present. A third vertical metal interconnect element 666 is formed in the dielectric layer 663 concurrently with the first vertical metal interconnect element 664, to make thermal contact to the silicon top layer 651, through the optional region of substrate metal silicide 662, if present. A horizontal metal interconnect element 667 is formed in the dielectric layer 663 using known methods, and preferably concurrently with other horizontal metal interconnect elements in the IC 650, to electrically connect the first vertical metal interconnect element 664 with the second vertical metal interconnect element 665, and to thermally connect the first thermoelectric element 653 and the second thermoelectric element 654 with the silicon top layer 651.

Figure 6F:
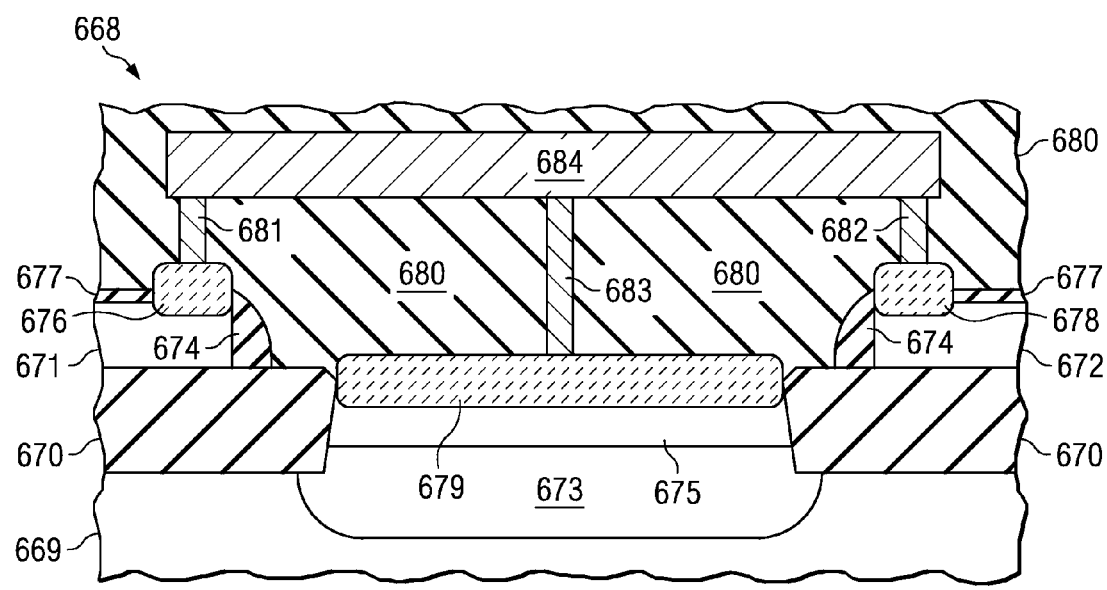

In FIG. 6F, an IC 668 includes a silicon top layer 669 of a substrate of the IC 668. Elements of field oxide 670 provide thermal isolation between the silicon top layer 669 and a first thermoelectric element 671 and a second thermoelectric element 672. An n-type isolation well 673 is formed in the silicon top layer 669 between the elements of field oxide 670 to provide electrical isolation of the first thermoelectric element 671 and the second thermoelectric element 672 from the substrate of the IC 668. Optional sidewall spacers 674 may be formed on lateral surfaces of the first thermoelectric element 671 and the second thermoelectric element 672. An optional n-type diffused region 675 may be formed in the silicon top layer 669, possibly concurrently with n-type source and drain regions of NMOS transistors in the IC 668. An optional first region of thermoelectric element metal silicide 676, as described in reference to FIG. 5A, may be formed on a top surface of the first thermoelectric element 671 in an open patterned area in a silicide block layer 677 on the top surface of the first thermoelectric element 671. Similarly, an optional second region of thermoelectric element metal silicide 678 may be formed concurrently with the optional first region of thermoelectric element metal silicide 676 on a top surface of the second thermoelectric element 672 in an open patterned area in the silicide block layer 677 on the top surface of the second thermoelectric element 672. An optional region of substrate metal silicide 679 may be formed on a top surface of the silicon top layer 669 between the elements of field oxide 670, concurrently with the first and second regions of thermoelectric element metal silicide 676, 678. A dielectric layer 680 is formed on an existing top surface of the IC 668 using known methods as described in reference to FIG. 5A. A first vertical metal interconnect element 681 is formed in the dielectric layer 680 using known methods, and preferably concurrently with other vertical metal interconnect elements in the IC 668, to make electrical and thermal contact to the first thermoelectric element 671, through the optional first region of thermoelectric element metal silicide 676, if present. A second vertical metal interconnect element 682 is formed in the dielectric layer 680 concurrently with the first vertical metal interconnect element 681, to make electrical and thermal contact to the second thermoelectric element 672, through the optional second region of thermoelectric element metal silicide 678, if present. A third vertical metal interconnect element 683 is formed in the dielectric layer 680 concurrently with the first vertical metal interconnect element 681, to make thermal contact to the silicon top layer 669, through the optional region of substrate metal silicide 679, if present. A horizontal metal interconnect element 684 is formed in the dielectric layer 680 using known methods, and preferably concurrently with other horizontal metal interconnect elements in the IC 668, to electrically connect the first vertical metal interconnect element 681 with the second vertical metal interconnect element 682, and to thermally connect the first thermoelectric element 681 and the second thermoelectric element 682 with the silicon top layer 669.

Figure 6G:
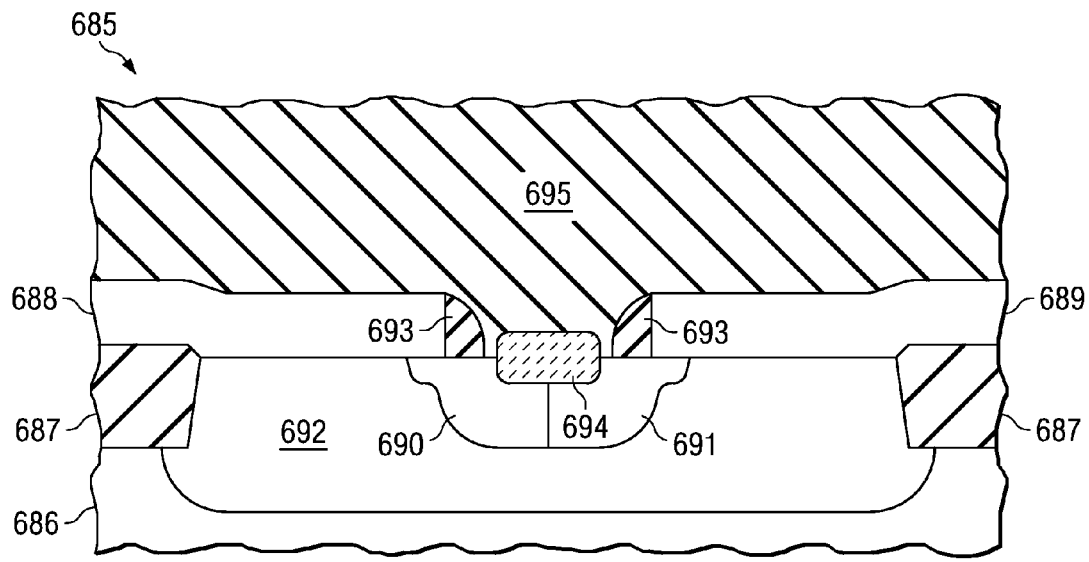

In FIG. 6G, an IC 685 includes a silicon top layer 686 of a substrate of the IC 685. Elements of field oxide 687 provide thermal isolation between the silicon top layer 686 and a first thermoelectric element 688 and a second thermoelectric element 689. A first extension well 690 of a same conductivity type as the first thermoelectric element 688 is formed in the silicon top layer 686 under, and electrically connected to, the first thermoelectric element 688. A second extension well 691 of a same conductivity type as the second thermoelectric element 689 is formed in the silicon top layer 686 under, and electrically connected to, the second thermoelectric element 689, contacting the first extension well 690. An n-type isolation well 692 is formed in the silicon top layer 686 between the elements of field oxide 687 to provide electrical isolation of the first thermoelectric element 688, the second thermoelectric element 689, the first extension well 690 and the second extension well 691 from the substrate of the IC 685. An end of the first extension well 690 and an end of the second extension well 691 contact each other in the silicon top layer 686 between the elements of field oxide 687. Optional sidewall spacers 693 may be formed on lateral surfaces of the first thermoelectric element 688 and the second thermoelectric element 689. An optional region of substrate metal silicide 694 may be formed, as described in reference to FIG. 5A, on a top surface of the silicon top layer 686 between the elements of field oxide 687. A dielectric layer 695 is formed on an existing top surface of the IC 685 using known methods as described in reference to FIG. 5A.

Figure 6H:
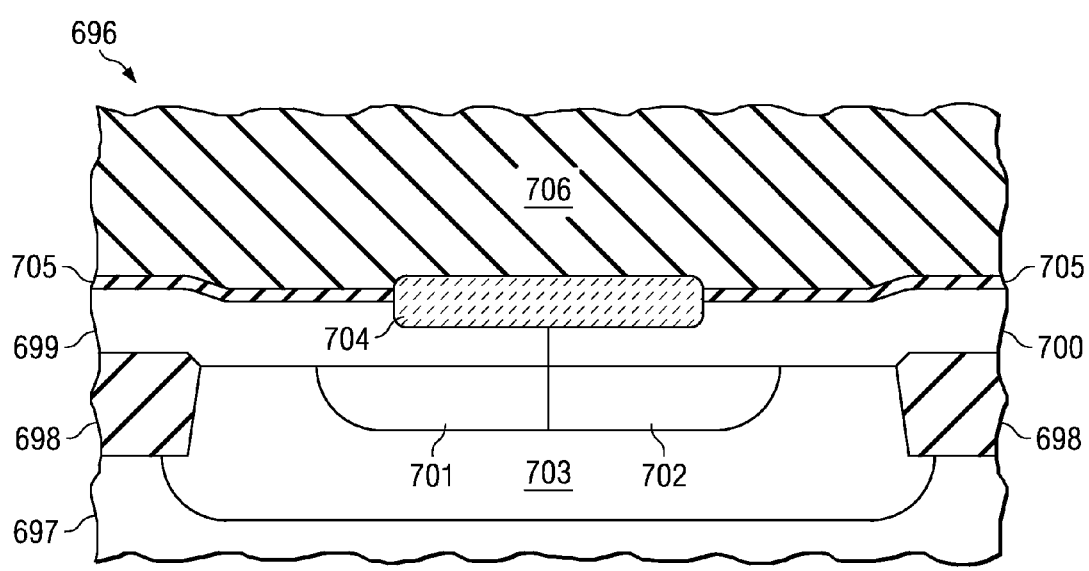

In FIG. 6H, an IC 696 includes a silicon top layer 697 of a substrate of the IC 696. Elements of field oxide 698 provide thermal isolation between the silicon top layer 696 and a first thermoelectric element 699 and a second thermoelectric element 700. A first extension well 701 of a same conductivity type as the first thermoelectric element 699 is formed in the silicon top layer 697 under, and electrically connected to, the first thermoelectric element 699. A second extension well 702 of a same conductivity type as the second thermoelectric element 700 is formed in the silicon top layer 697 under, and electrically connected to, the second thermoelectric element 700, contacting the first extension well 701. An n-type isolation well 703 is formed in the silicon top layer 697 between the elements of field oxide 698 to provide electrical isolation of the first thermoelectric element 699, the second thermoelectric element 700, the first extension well 701 and the second extension well 702 from the substrate of the IC 696. An end of the first extension well 701 and an end of the second extension well 702 contact each other in the silicon top layer 697 between the elements of field oxide 698. A region of thermoelectric element metal silicide 704, as described in reference to FIG. 5A, may be formed on a top surface of the first thermoelectric element 699 and on a top surface of the second thermoelectric element 700 in an open patterned area in a silicide block layer 705 on the top surface of the first thermoelectric element 699 and on the top surface of the second thermoelectric element 700, so as to electrically connect the first thermoelectric element 699 with the second thermoelectric element 700. A dielectric layer 706 is formed on an existing top surface of the IC 696 using known methods as described in reference to FIG. 5A.

Those skilled in the art to which the invention relates will appreciate that many other embodiments and variations are possible within the scope of the claimed invention.

What is claimed is:
1. A thermoelectric device, comprising:
   a metal thermal terminal at a top end of said thermoelectric device;
   a vertical thermally conductive conduit, further comprising horizontal metal interconnect elements and vertical metal interconnect elements, which is thermally connected at a top end to said metal thermal terminal and configured so as to conduct heat vertically from said metal thermal terminal;
   a lateral thermoelectric element that includes polycrystalline silicon, configured such that a first end of said lateral thermoelectric element is thermally connected to a bottom end of said vertical thermally conductive conduit, and a second end of said lateral thermoelectric element is thermally connected to a silicon substrate; and
   a region of silicon dioxide thicker than 250 nanometers formed in said silicon substrate under said lateral thermoelectric element.

2. The thermoelectric device of claim 1, wherein said metal thermal terminal is a first metal thermal terminal, said vertical thermally conductive conduit is a first vertical thermally conductive conduit, said lateral thermoelectric element is a first lateral thermoelectric element, and said region of silicon dioxide if a first region of silicon dioxide, the thermoelectric device further including:
   a second metal thermal terminal at said top end of said thermoelectric device;
   a second vertical thermally conductive conduit, further including horizontal metal interconnect elements and vertical metal interconnect elements, which is thermally connected on a top end to said second metal thermal terminal and configured so as to conduct heat vertically from said second metal thermal terminal;
   a second lateral thermoelectric element, configured such that a first end of said second lateral thermoelectric element is thermally connected to a bottom end of said second vertical thermally conductive conduit, and a second end of said second lateral thermoelectric element is thermally connected to said silicon substrate and is electrically connected to said first end of said first lateral thermoelectric element; and a second region of silicon dioxide thicker than 250 nanometers formed in said silicon substrate under said second lateral thermoelectric element.

3. The thermoelectric device of claim 1, wherein said metal thermal terminal is a first metal thermal terminal, said vertical thermally conductive conduit is a first vertical thermally conductive conduit, said lateral thermoelectric element is a first lateral thermoelectric element, and said region of silicon dioxide if a first region of silicon dioxide, the thermoelectric device further including:
a second lateral thermoelectric element, of an opposite conductivity type than said first lateral thermoelectric element, configured such that a first end of said second lateral thermoelectric element is thermally connected to a bottom end of said first vertical thermally conductive conduit, and a second end of said second lateral thermoelectric element is thermally connected to said silicon substrate;
a second metal thermal terminal at said top end of said thermoelectric device;
a second vertical thermally conductive conduit, further comprising horizontal metal interconnect elements and vertical metal interconnect elements, which is thermally connected on a top end to said second metal thermal terminal and configured so as to conduct heat vertically from said second metal thermal terminal;
a third lateral thermoelectric element, of the same conductivity type as said first lateral thermoelectric element, configured such that a first end of said third lateral thermoelectric element is thermally connected to a bottom end of said second vertical thermally conductive conduit, and a second end of said third lateral thermoelectric element is thermally connected to said silicon substrate and is electrically connected to said second end of said second lateral thermoelectric element;
a fourth lateral thermoelectric element, of the same conductivity type as said second lateral thermoelectric element, configured such that a first end of said fourth lateral thermoelectric element is thermally connected to said bottom end of said second vertical thermally conductive conduit, and a second end of said fourth lateral thermoelectric element is thermally connected to said silicon substrate;
a second region of silicon dioxide thicker than 250 nanometers formed in said silicon substrate under said second lateral thermoelectric element;
a third region of silicon dioxide thicker than 250 nanometers formed in said silicon substrate under said third lateral thermoelectric element; and
a fourth region of silicon dioxide thicker than 250 nanometers formed in said silicon substrate under said fourth lateral thermoelectric element.

4. The thermoelectric device of claim 3, further including:
a first extension well of a same conductivity type as said first lateral thermoelectric element, formed in said silicon substrate, configured such that a first end of said first extension well contacts said first lateral thermoelectric element;
a second extension well of a same conductivity type as said second lateral thermoelectric element, formed in said silicon substrate, configured such that a first end of said second extension well contacts said second lateral thermoelectric element, and a second end of said second extension well contacts a second end of said first extension well;
a third extension well of a same conductivity type as said third lateral thermoelectric element, formed in said silicon substrate, configured such that a first end of said third extension well contacts said third lateral thermoelectric element; and
a fourth extension well of a same conductivity type as said fourth lateral thermoelectric element, formed in said silicon substrate, configured such that a first end of said fourth extension well contacts said fourth lateral thermoelectric element, and a second end of said fourth extension well contacts a second end of said third extension well.

5. The thermoelectric device of claim 1, further including an electrically insulating layer less than 20 nanometers thick formed in said vertical thermally conductive conduit such that a first subset of said horizontal metal interconnect elements and vertical metal interconnect elements is electrically isolated from remaining said horizontal metal interconnect elements and vertical metal interconnect elements.

6. The thermoelectric device of claim 1, further including a thermally insulating region formed under said region of silicon dioxide.

7. The thermoelectric device of claim 1, in which:
said silicon substrate is p-type; and
further comprising an n-type isolation well, formed in said silicon substrate under said second end of said lateral thermoelectric element, and electrically connected to said second end of said lateral thermoelectric element.

8. The thermoelectric device of claim 1, further including:
a dielectric layer less than 20 nanometers thick formed on a top surface of said silicon substrate, such that said second end of said lateral thermoelectric element contacts a top surface of said dielectric layer.

9. An integrated circuit, comprising:
a first metal thermal terminal formed at a top surface of said integrated circuit;
a second metal thermal terminal formed at said top surface of said integrated circuit;
a first vertical thermally conductive conduit formed in said integrated circuit, further comprising horizontal metal interconnect elements and vertical metal interconnect elements, which is thermally connected on a top end to said first metal thermal terminal and configured so as to conduct heat vertically from said first metal thermal terminal;
a second vertical thermally conductive conduit formed in said integrated circuit, further comprising horizontal metal interconnect elements and vertical metal interconnect elements, which is thermally connected on a top end to said second metal thermal terminal and configured so as to conduct heat vertically from said second metal thermal terminal;
a first lateral thermoelectric element formed in said integrated circuit, configured such that a first end of said first lateral thermoelectric element is thermally connected to a bottom end of said first vertical thermally conductive conduit, and a second end of said first lateral thermoelectric element is thermally connected to a silicon substrate of said integrated circuit;
a second lateral thermoelectric element formed in said integrated circuit, configured such that a first end of said second lateral thermoelectric element is thermally connected to a bottom end of said second vertical thermally conductive conduit, and a second end of said second lateral thermoelectric element is thermally connected to said silicon substrate of said integrated circuit;
a first region of silicon dioxide thicker than 250 nanometers formed in said silicon substrate under said first lateral thermoelectric element;

a second region of silicon dioxide thicker than 250 nanometers formed in said silicon substrate under said second lateral thermoelectric element;
a first electrically conducting element between an electrically negative end of said first lateral thermoelectric element and an electrically positive end of said second lateral thermoelectric element;
a second electrically conducting element between an electrically positive end of said first lateral thermoelectric element and a first transistor formed in said integrated circuit; and
a third electrically conducting element between an electrically negative end of said second lateral thermoelectric element and a second transistor formed in said integrated circuit.

10. The integrated circuit of claim 9, wherein said first lateral thermoelectric element is comprised of polycrystalline silicon; and said second lateral thermoelectric element is comprised of polycrystalline silicon.

11. The integrated circuit of claim 10, further comprising:
a first electrically insulating layer less than 20 nanometers thick formed in said first vertical thermally conductive conduit such that a first subset of said horizontal metal interconnect elements and vertical metal interconnect elements contained in said first vertical thermally conductive conduit is electrically isolated from remaining said horizontal metal interconnect elements and vertical metal interconnect elements contained in said first vertical thermally conductive conduit; and
a second electrically insulating layer less than 20 nanometers thick formed in said second vertical thermally conductive conduit such that a first subset of said horizontal metal interconnect elements and vertical metal interconnect elements contained in said second vertical thermally conductive conduit is electrically isolated from remaining said horizontal metal interconnect elements and vertical metal interconnect elements contained in said second vertical thermally conductive conduit.

12. The integrated circuit of claim 9, further comprising:
a first thermally insulating region formed under said first region of silicon dioxide; and
a second thermally insulating region formed under said second region of silicon dioxide.

13. The integrated circuit of claim 9, wherein said silicon substrate is p-type, the integrated circuit further comprising
a first n-type isolation well, formed in said silicon substrate under said second end of said first lateral thermoelectric element, and electrically connected to said second end of said first lateral thermoelectric element; and
a second n-type isolation well, formed in said silicon substrate under said second end of said second lateral thermoelectric element, and electrically connected to said second end of said second lateral thermoelectric element.

14. The integrated circuit of claim 9, further comprising:
a dielectric layer less than 20 nanometers thick formed on a top surface of said silicon substrate, such that said second end of said first lateral thermoelectric element contacts a top surface of said dielectric layer and said second end of said second lateral thermoelectric element contacts said top surface of said dielectric layer.

15. A thermoelectric device, comprising:
a first metal thermal terminal at a top end of said thermoelectric device;
a first vertical thermally conductive conduit, further comprising horizontal metal interconnect elements and vertical metal interconnect elements, which is thermally connected at a top end to said first metal thermal terminal and configured so as to conduct heat vertically from said first metal thermal terminal;
a first lateral thermoelectric element, configured such that a first end of said first lateral thermoelectric element is thermally connected to a bottom end of said first vertical thermally conductive conduit, and a second end of said first lateral thermoelectric element is thermally connected to a silicon substrate;
a first region of silicon dioxide thicker than 250 nanometers formed in said silicon substrate under said first lateral thermoelectric element;
a second lateral thermoelectric element, of an opposite conductivity type than said first lateral thermoelectric element, configured such that a first end of said second lateral thermoelectric element is thermally connected to a bottom end of said first vertical thermally conductive conduit, and a second end of said second lateral thermoelectric element is thermally connected to said silicon substrate;
a second metal thermal terminal at said top end of said thermoelectric device;
a second vertical thermally conductive conduit, further comprising horizontal metal interconnect elements and vertical metal interconnect elements, which is thermally connected on a top end to said second metal thermal terminal and configured so as to conduct heat vertically from said second metal thermal terminal;
a third lateral thermoelectric element, of the same conductivity type as said first lateral thermoelectric element, configured such that a first end of said third lateral thermoelectric element is thermally connected to a bottom end of said second vertical thermally conductive conduit, and a second end of said third lateral thermoelectric element is thermally connected to said silicon substrate and is electrically connected to said second end of said second lateral thermoelectric element;
a fourth lateral thermoelectric element, of the same conductivity type as said second lateral thermoelectric element, configured such that a first end of said fourth lateral thermoelectric element is thermally connected to said bottom end of said second vertical thermally conductive conduit, and a second end of said fourth lateral thermoelectric element is thermally connected to said silicon substrate;
a second region of silicon dioxide thicker than 250 nanometers formed in said silicon substrate under said second lateral thermoelectric element;
a third region of silicon dioxide thicker than 250 nanometers formed in said silicon substrate under said third lateral thermoelectric element; and
a fourth region of silicon dioxide thicker than 250 nanometers formed in said silicon substrate under said fourth lateral thermoelectric element.

16. The thermoelectric device of claim 15, further comprising:
a first extension well of a same conductivity type as said first lateral thermoelectric element, formed in said silicon substrate, configured such that a first end of said first extension well contacts said first lateral thermoelectric element;
a second extension well of a same conductivity type as said second lateral thermoelectric element, formed in said silicon substrate, configured such that a first end of said second extension well contacts said second lateral thermoelectric element, and a second end of said second extension well contacts a second end of said first extension well;

a third extension well of a same conductivity type as said third lateral thermoelectric element, formed in said silicon substrate, configured such that a first end of said third extension well contacts said third lateral thermoelectric element; and a fourth extension well of a same conductivity type as said fourth lateral thermoelectric element, formed in said silicon substrate, configured such that a first end of said fourth extension well contacts said fourth lateral thermoelectric element, and a second end of said fourth extension well contacts a second end of said third extension well.

17. An integrated circuit including a thermoelectric device, comprising:

a metal thermal terminal at a top end of said thermoelectric device;

a vertical thermally conductive conduit, further comprising horizontal metal interconnect elements and vertical metal interconnect elements, which is thermally connected at a top end to said metal thermal terminal and configured so as to conduct heat vertically from said metal thermal terminal;

a lateral thermoelectric element, configured such that a first end of said lateral thermoelectric element is thermally connected to a bottom end of said vertical thermally conductive conduit, and a second end of said lateral thermoelectric element is thermally connected to a silicon substrate;

a region of silicon dioxide thicker than 250 nanometers formed in said silicon substrate under said lateral thermoelectric element; and an electrically insulating layer less than 20 nanometers thick formed in said vertical thermally conductive conduit such that a first subset of said horizontal metal interconnect elements and vertical metal interconnect elements is electrically isolated from remaining said horizontal metal interconnect elements and vertical metal interconnect elements.

18. An integrated circuit including a thermoelectric device, comprising:

a metal thermal terminal at a top end of said thermoelectric device;

a vertical thermally conductive conduit, further comprising horizontal metal interconnect elements and vertical metal interconnect elements, which is thermally connected at a top end to said metal thermal terminal and configured so as to conduct heat vertically from said metal thermal terminal;

a lateral thermoelectric element, configured such that a first end of said lateral thermoelectric element is thermally connected to a bottom end of said vertical thermally conductive conduit, and a second end of said lateral thermoelectric element is thermally connected to a p-type silicon substrate;

a region of silicon dioxide thicker than 250 nanometers formed in said p-type silicon substrate under said lateral thermoelectric element; and an n-type isolation well, formed in said p-type silicon substrate under said second end of said lateral thermoelectric element, and electrically connected to said second end of said lateral thermoelectric element.

19. An integrated circuit including a thermoelectric device, comprising:

a metal thermal terminal at a top end of said thermoelectric device;

a vertical thermally conductive conduit, further comprising horizontal metal interconnect elements and vertical metal interconnect elements, which is thermally connected at a top end to said metal thermal terminal and configured so as to conduct heat vertically from said metal thermal terminal;

a lateral thermoelectric element, configured such that a first end of said lateral thermoelectric element is thermally connected to a bottom end of said vertical thermally conductive conduit, and a second end of said lateral thermoelectric element is thermally connected to a silicon substrate;

a region of silicon dioxide thicker than 250 nanometers formed in said silicon substrate under said lateral thermoelectric element; and a dielectric layer less than 20 nanometers thick formed on a top surface of said silicon substrate, such that said second end of said lateral thermoelectric element contacts a top surface of said dielectric layer.

20. The integrated circuit of claim 19, wherein the lateral thermoelectric element includes polycrystalline silicon.

* * * * *